US012658677B2

(12) United States Patent
Garreau et al.

(10) Patent No.: US 12,658,677 B2
(45) Date of Patent: Jun. 16, 2026

(54) OPTO-ELECTRONIC DEVICE

(71) Applicant: Nokia Solutions and Networks Oy, Espoo (FI)

(72) Inventors: Alexandre Garreau, Antony (FR); Jean Francois Paret, Arpajon (FR); Quentin Hochart, Massy (FR)

(73) Assignee: Nokia Solutions and Networks Oy, Espoo (FI)

( * ) Notice: Subject to any disclaimer, the term of this patent is extended or adjusted under 35 U.S.C. 154(b) by 553 days.

(21) Appl. No.: 18/335,584

(22) Filed: Jun. 15, 2023

(65) Prior Publication Data
US 2024/0039250 A1       Feb. 1, 2024

(30) Foreign Application Priority Data
Jul. 21, 2022     (EP) .................................... 22306085

(51) Int. Cl.
| *H01S 5/50* | (2006.01) |
| *H01S 5/02* | (2006.01) |
| *H01S 5/028* | (2006.01) |
| *H01S 5/10* | (2021.01) |

(52) U.S. Cl.
CPC .............. *H01S 5/50* (2013.01); *H01S 5/0206* (2013.01); *H01S 5/0285* (2013.01); *H01S 5/1014* (2013.01); *H01S 2304/04* (2013.01)

(58) Field of Classification Search
CPC ........ H01S 5/50; H01S 5/0206; H01S 5/0285;

H01S 5/1014; H01S 5/0422; H01S 5/22; H01S 5/106; H01S 5/1064; H01S 5/0207; H01S 2304/04; G02B 6/12004; G02B 2006/12035; G02B 2006/12078; G02B 2006/12085; G02B 2006/121; G02B 2006/12176; G02B 2006/12178; G02B 2006/12195; G02F 1/392

See application file for complete search history.

(56) References Cited

FOREIGN PATENT DOCUMENTS

WO          2021/094473 A1      5/2021

OTHER PUBLICATIONS

Office Communication for European Application No. 22 306 085.6 dated Jan. 21, 2025.
H. Sato, "Improved High-Temperature Characteristics in a Thickness-Tapered 1.3-um Beam-Expander Integrated Ridge-Waveguide Laser," IEEE Photonics Technology Letters, vol. 10, No. 4, Apr. 1998, pp. 484-486.
Kenichi Iga et al., "Surface Emitting Semiconductor Lasers," IEEE Journal of Quantum Electronics, vol. 24, No. 9, Sep. 1988, pp. 1845-1855.

*Primary Examiner* — Matthew Mikels
(74) *Attorney, Agent, or Firm* — Brake Hughes Bellermann LLP

(57)          ABSTRACT
The present invention concerns an optoelectronic device D such as a Semiconductor optical amplifier (SOA) working in a continuous wave condition and able to amplify high frequencies optical signals. The optoelectronic device D comprise an active zone I (such as SOA) with a slab (3) in a direct bias working in a continuous wave and a taper zone (II) connected to the active zone (I).

16 Claims, 17 Drawing Sheets

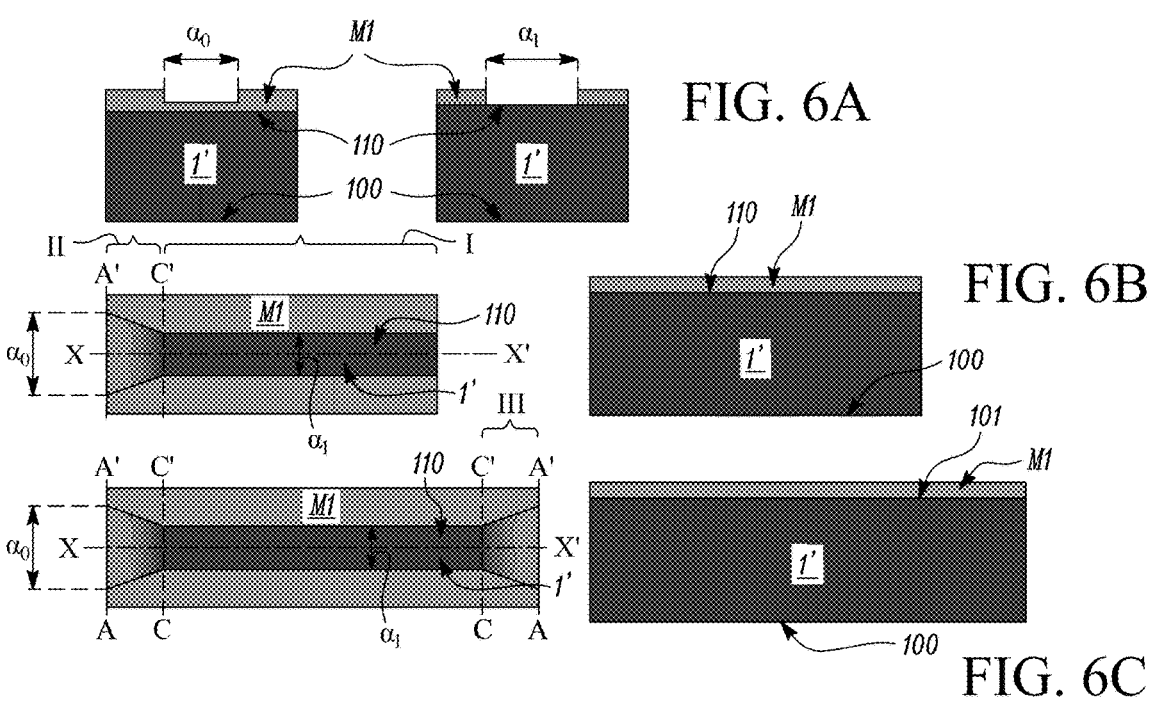
FIG. 6A
FIG. 6B
FIG. 6C
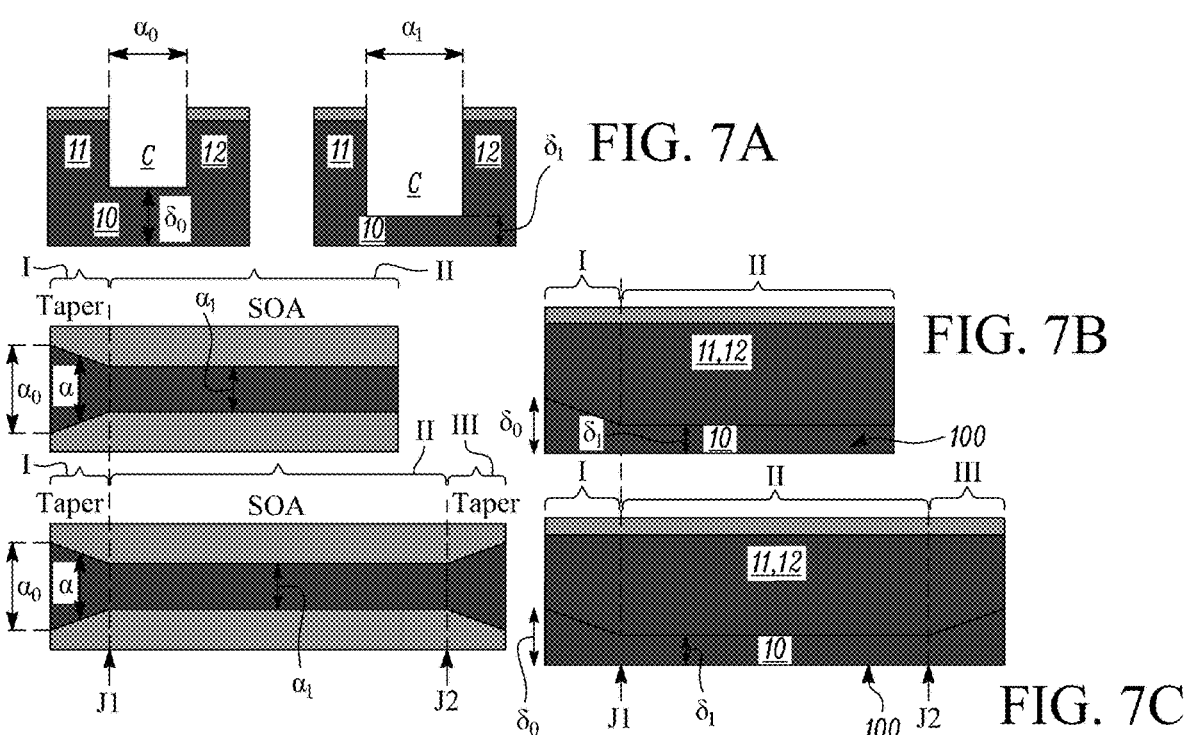
FIG. 7A
FIG. 7B
FIG. 7C

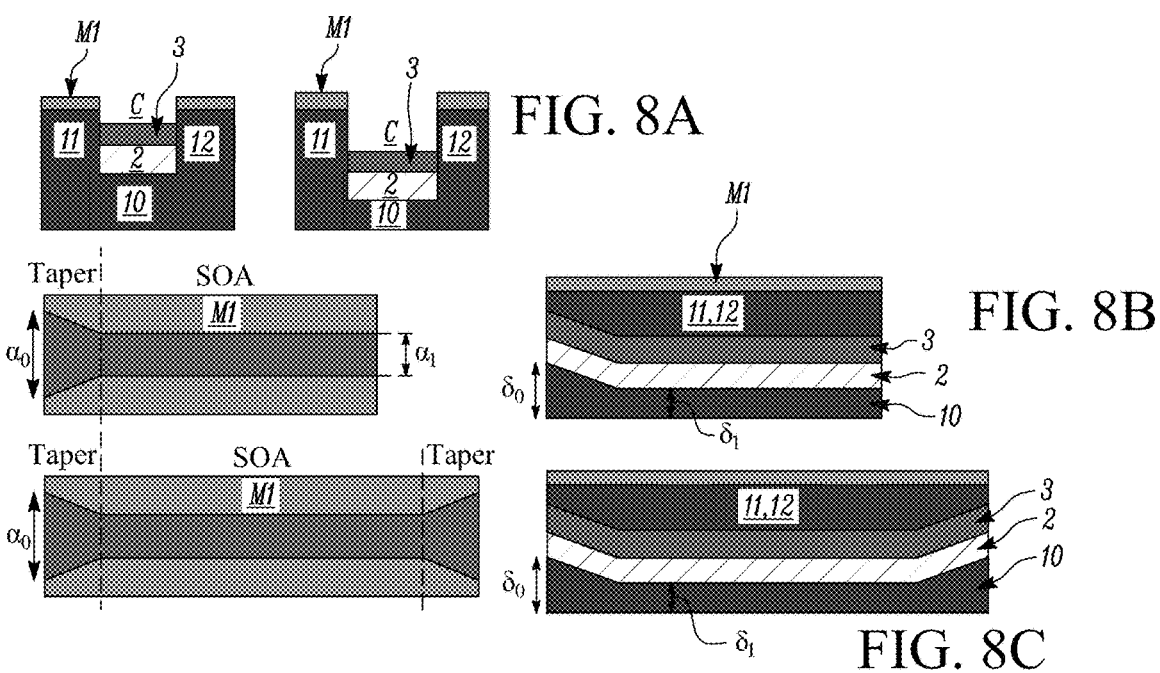
FIG. 8A
FIG. 8B
FIG. 8C
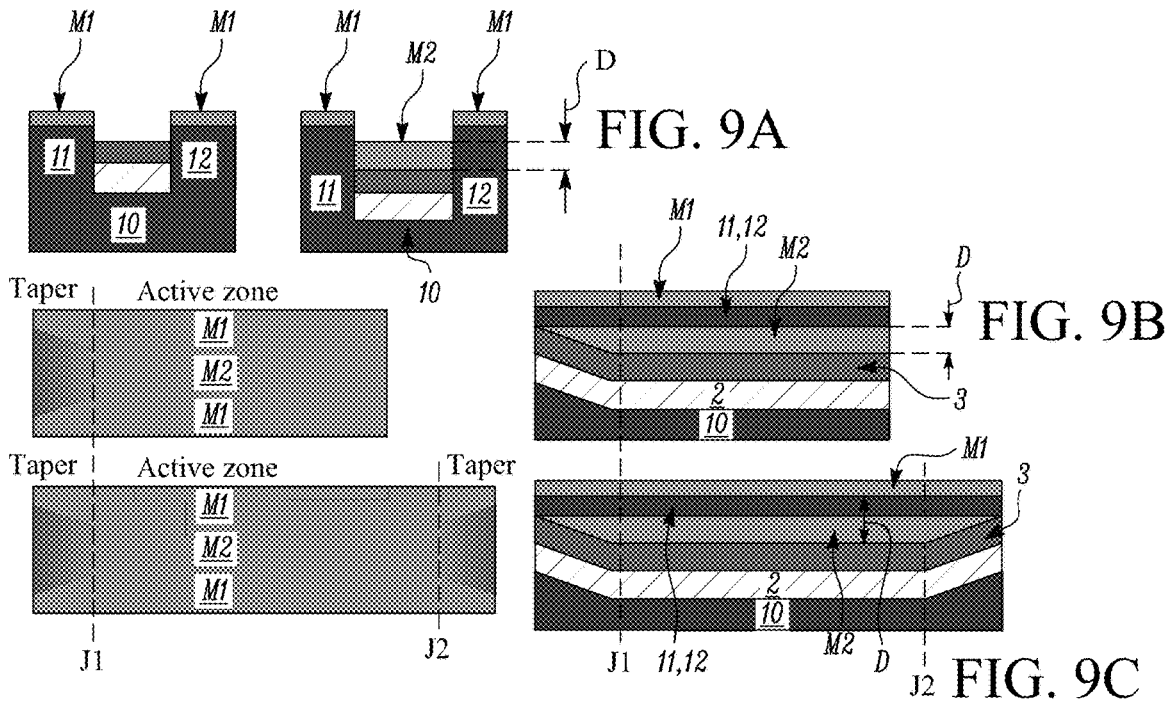
FIG. 9A
FIG. 9B
FIG. 9C

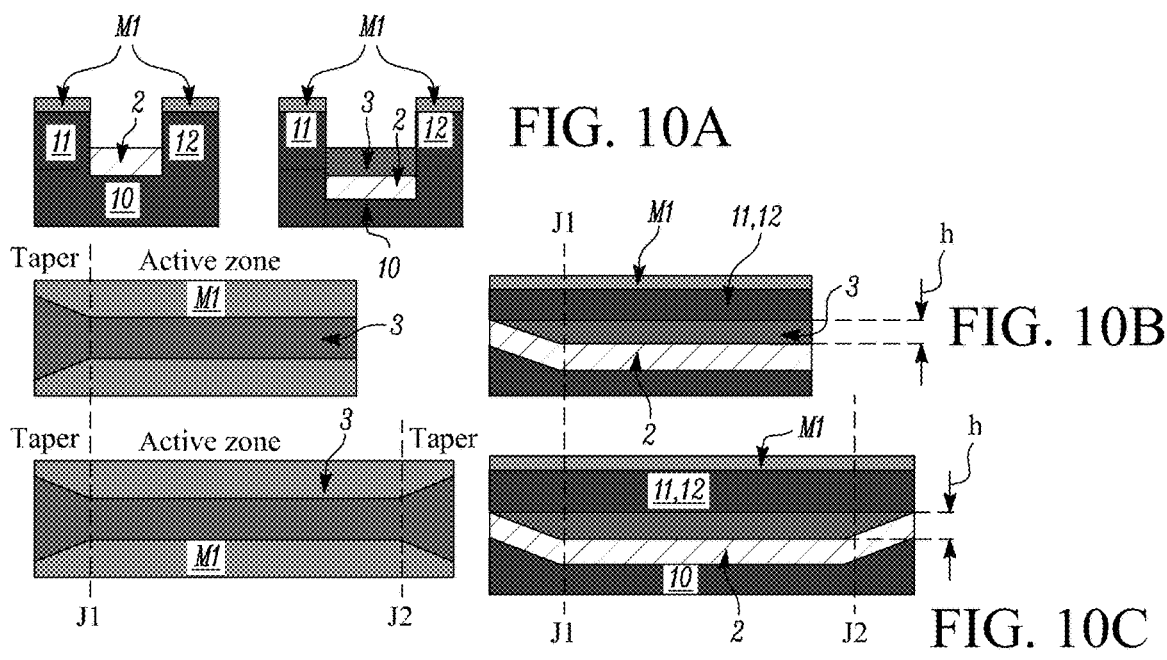
FIG. 10A
FIG. 10B
FIG. 10C
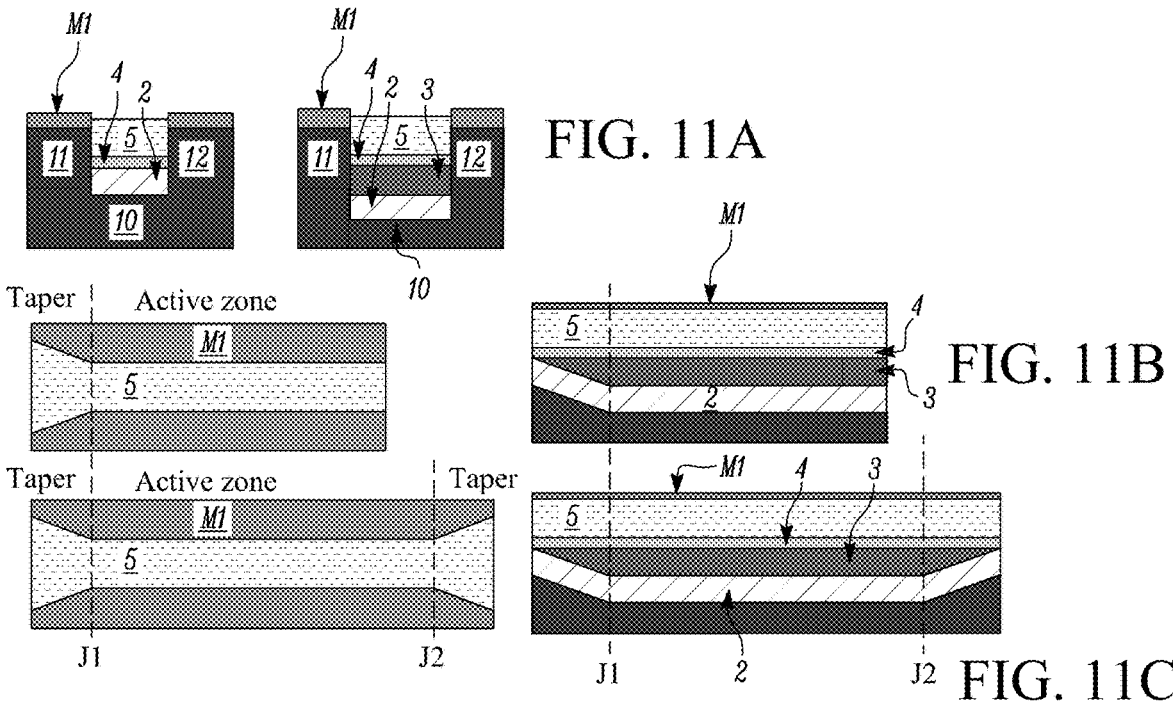
FIG. 11A
FIG. 11B
FIG. 11C

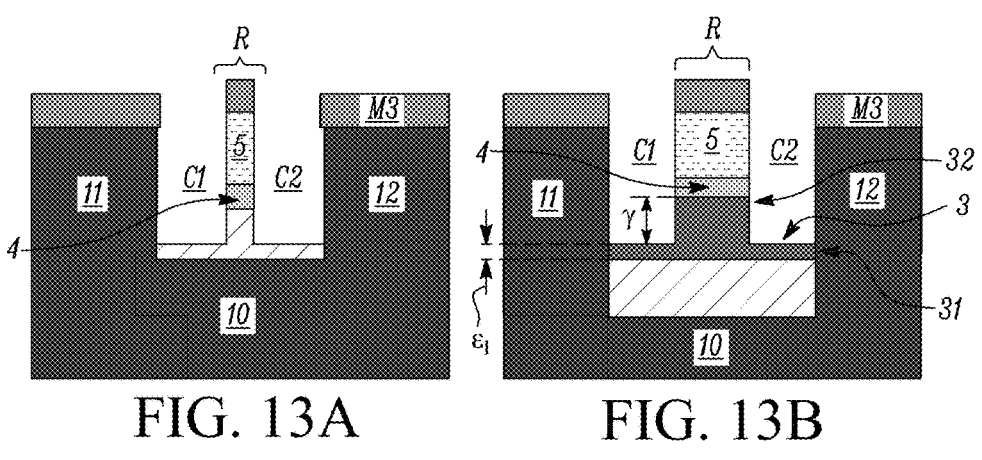
FIG. 13A        FIG. 13B
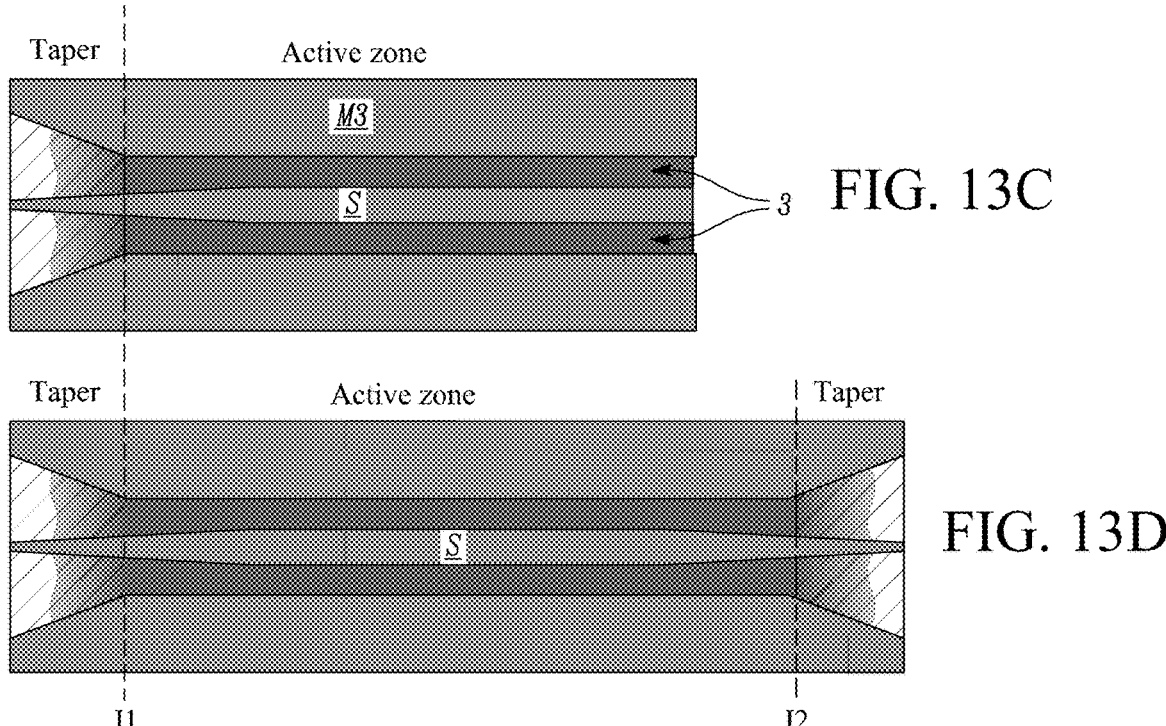
FIG. 13C
FIG. 13D

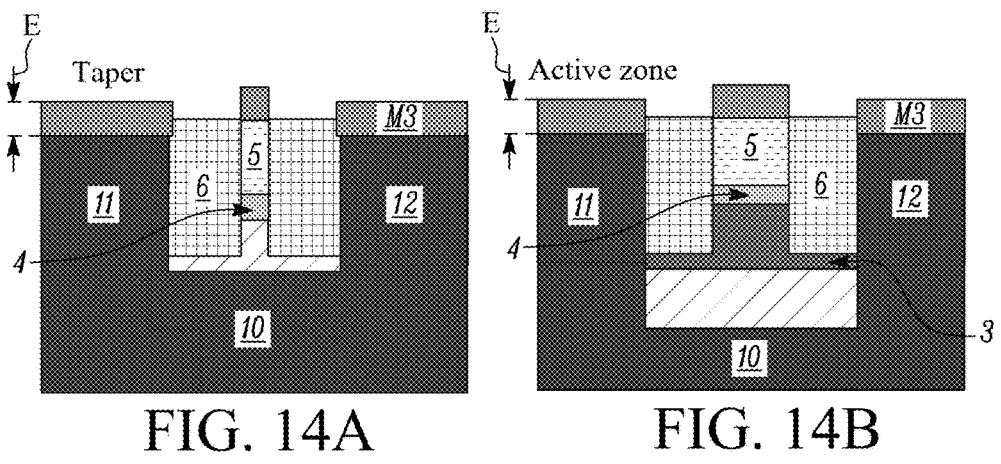
FIG. 14A          FIG. 14B
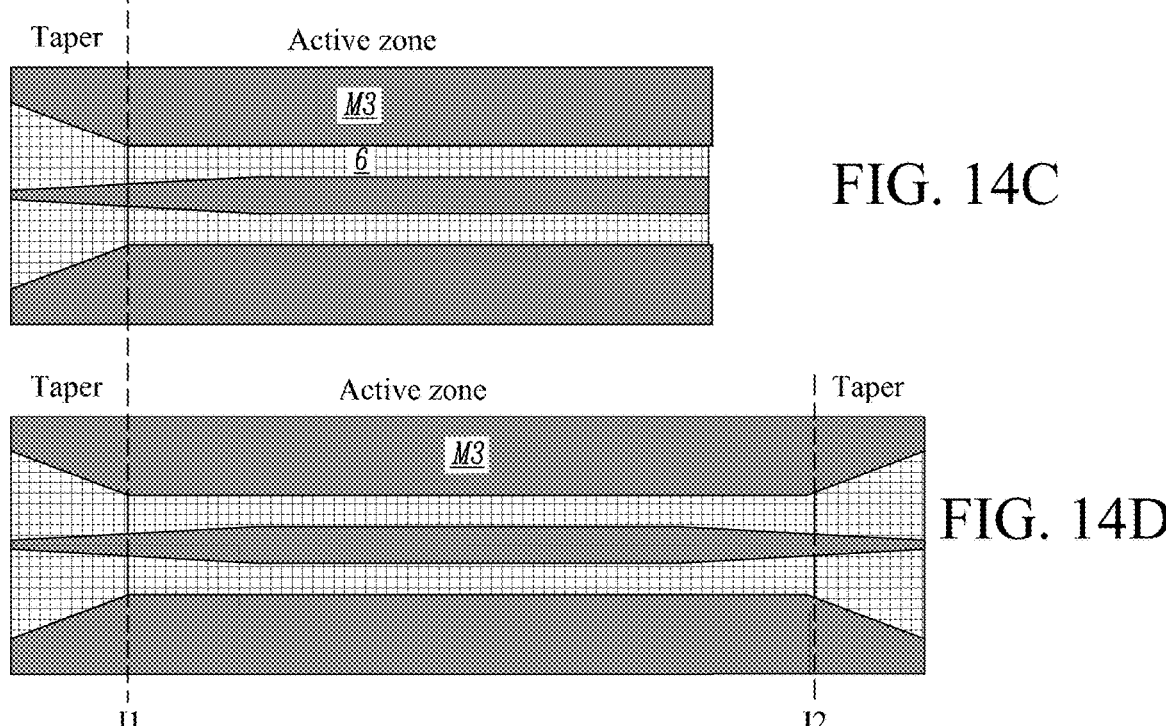
FIG. 14C
FIG. 14D

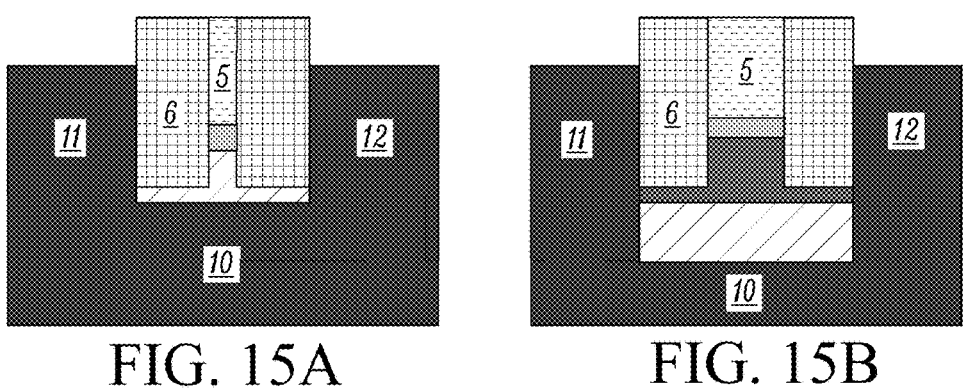
FIG. 15A　　　　FIG. 15B
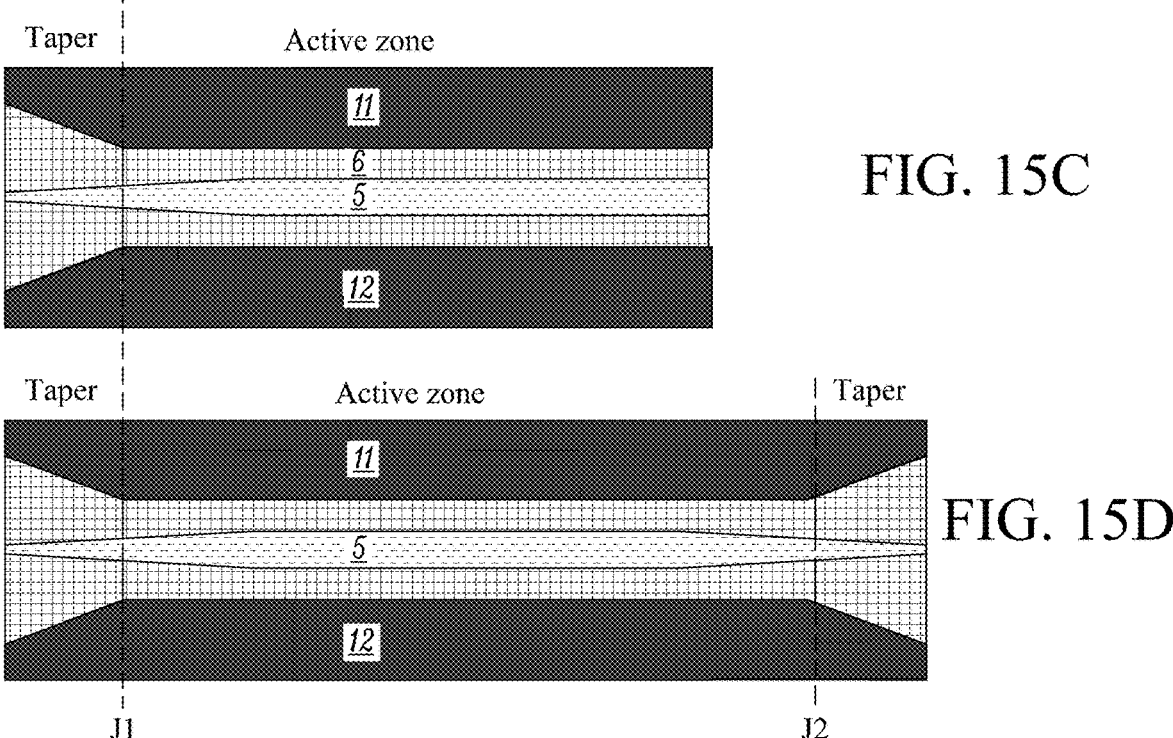
FIG. 15C
FIG. 15D

OPTO-ELECTRONIC DEVICE

CROSS-REFERENCE TO RELATED APPLICATIONS

This application claims priority under 35 U.S.C. § 119 to European Application No. 22306085.6, filed Jul. 21, 2022, the entire contents of which are hereby incorporated by reference.

TECHNICAL FIELD

Various example embodiments relate to various optoelectronic devices such as (but not limitative to) Semiconductor optical amplifier (usually known by the acronym SOA) devices or electro-absorption modulators or a distributed feedback lasers etc. In particular, embodiments according to the invention relate to the provision and realization of such optoelectronic devices working in a continuous wave condition and able to amplify high frequencies optical signals.

BACKGROUND

As known by those skilled in the art, semiconductor optical devices such as e.g. semiconductor amplifiers (usually known by the acronym SOA) are used for long-distance transmission (10-100 km) telecom applications.

However, the state-of-the-art devices using multiple quantum well based ridge structures show drawbacks such as the mechanical fragility of the ridge. When trying to compensate this mechanical fragility using classical techniques this may result in heat dissipation which may disturb the quantum efficiency of the multi quantum wells of the optical guide.

SUMMARY

Example embodiments of the invention therefore aim to remedy the disadvantages of the prior art devices.

The embodiments and features, if any, described in this specification that do not fall under the scope of the independent claims are to be interpreted as examples useful for understanding various embodiments of the invention.

A general embodiment relates to a semiconductor optical device comprising:

a substrate of n-doped III-V semiconductor material with a longitudinal axis XX' and presenting a base with a planar bottom surface and an upper surface and side walls that are perpendicular to said base, said substrate including a central longitudinal cavity C of U-shaped cross-section, whose width $\alpha$ and height $\delta$ in a direction perpendicular to the XX' axis from the planar bottom surface vary along said longitudinal axis XX', so as to define at least 2 zones along said longitudinal axis XX' delimited by a first junction:

a first active zone, wherein the bottom surface and the upper surface of the base are parallel to each other and spaced from each other by a constant height $\delta$-$\delta 1$, and the central longitudinal cavity presents a constant width $\alpha$-$\alpha_1$, a second zone constituting a first taper zone, wherein the upper surface describes a continuous curved or planar surface comprising two opposite ends perpendicular to the longitudinal axis XX', one of the ends, being located at a height $\delta 1$ at the first junction which is lower than the height $\delta_0$ at the free end of the first taper zone, the width $\alpha$ varying from $\alpha_1$ at the first junction to $\alpha_0$ at the free end of the first taper zone, a layer of n-doped III-V semi-conductor material positioned on the upper surface of the base inside said cavity, a layer of n-inactive III-V optical waveguide material positioned on the layer of n-doped III-V semi-conductor material inside said cavity, said layer of n-inactive III-V optical waveguide material having an inverted T shape in a cross-section perpendicular to the longitudinal axis XX', so as to form a slab with a bottom of thickness $\varepsilon$ and an edge of thickness $\gamma$, with $\varepsilon$ being constant and equal to $\varepsilon_1$ within the first active zone and varying within the first taper zone from $\varepsilon_1$ at the first junction to 0 at the free end of the first taper zone, and with $\gamma$ being constant and equal to $\gamma_1$ in the first active zone and varying within the first taper zone from $\gamma_1$ at the first junction to 0 at the free end of the first taper zone;

said semiconductor optical device further comprising:

a central ribbon having a width $\beta$ and comprising, on the edge of the slab, a first buried optical waveguide beneath a layer of p-doped III-V semi-conductor, a pair of channels into the n-inactive III-V optical waveguide along the longitudinal axis XX' and being located on both sides of the central ribbon, said longitudinal channels being each filled by a semi-insulating stack or an insulating stack, said channels being longitudinal and parallel to each other and of constant width $W_1$ within the first active zone, within the first active zone, metal stripes covering the top of each sidewall and a metal stripe covering the top of the layer of p-doped III-V semi-conductor.

The device of the general embodiment presents the following advantages:

The first active zone comprises a slab in a direct bias working in a continuous wave The device is composed of a taper connected to the first active zone. In the case of a stand-alone device, the optical mode at the outside of the taper can be easily coupled with an optical fiber. In the case of a Photonic Integrated Circuit, the device can be easily combined with other optical functions.

The slab structure in the taper zone becomes less and less important, which permits to keep the single optical mode feature.

The p and n contacts are on the same level on the same wafer face and can be easily soldered on the flip-chip package.

The mechanical weakness is suppressed.

This structure allows to minimize the wire bonding which limits the Joule effect due to possible current intensity. It also limits parasitic capacitance or inductance limiting the optical high speed data transmission.

The heat produced by the photon generation in the active zone can be easily evacuated because of the no presence of resin generating a thermal resistivity.

Advantageously, the first active zone may comprise a semiconductor optical amplifier (usually known by the acronym SOA), or a laser, or a modulator, or a laser modulator, or a laser Semiconductor Optical Amplifier, or a laser modulator Semiconductor Optical Amplifier According to a first example of the general embodiment (hereinafter referred to as first embodiment), the semiconductor optical device further comprises:

an anti-reflective coating $R_{min}$ positioned at the free end of the first taper zone (II), and a reflective coating $R_{max}$ positioned at the end of the first active zone that is opposite to the first junction between said first active zone and said first taper zone, so that the anti-reflective coating $R_{min}$ constitutes the entrance and the output of said semiconductor optical device working in reflection.

According to a second example of the general embodiment (hereinafter referred to as first embodiment), the semiconductor optical device further comprises:

a second taper zone at the end of the first active zone that is opposite to the first junction, thus defining a second junction between the second tape zone and the first active zone, and an anti-reflective coating Rmin positioned at the free ends of the first taper zone and second taper zones, so that one of the anti-reflective coatings $R_{min}$ constitutes the entrance of said semiconductor optical device and the other anti-reflective coatings $R_{min}$ constitutes the output of said semiconductor optical device working in transmission.

The width $\alpha_1$ of the central longitudinal cavity may be constant within the first active zone.

Within the first taper zone and, if applicable, the second taper zone (III), the width $\alpha$ of the central longitudinal cavity may increases from $\alpha_1$ at the first junction and, if applicable, at the second junction to $\alpha_0$ at the free ends of the first taper zone and if applicable, of the second taper zone. In that configuration, the composition of the buried optical waveguide of the taper and of the first active zone are different as a result of Selective Area Growth effect during a MOCVD epitaxy.

Advantageously, the width $\beta$ of the central ribbon (R) within the first active zone (I) may continuously vary from 1.5 µm at the first junction and, if applicable, at the second junction to 15 µm in the middle of the first active zone, and the width $\beta$ of the central ribbon within the first taper zone and, if applicable, of the second taper zone may vary from 1.5 µm at the first junction and, if applicable, at the second junction to 0.1 µm at the free ends of the first taper zone and, if applicable, of the second taper zone.

Advantageously, the global height $h=\varepsilon+\gamma$ of the slab may vary:

within the first active zone, from 1 µm at the first junction and, if applicable, at the second junction to 10 µm in the middle of the first active zone;

within the first taper zone and, if applicable, of the second taper zones, from 1 µm at the first junction and, if applicable, at the second junction to 0 at the free ends of the first taper zone and, if applicable, of the second taper zone.

Advantageously, the upper surface of the base may be planar and define a slope from one of the free ends of the first and, if applicable, of the second taper zones down to the first junction and, if applicable, the second junction, said slope having a height difference $\delta_0-\delta_1$ of 0.05 µm.

Advantageously, the first active zone may comprise a Semiconductor optical amplifier (SOA), or a laser, or a modulator, or a laser modulator, or a laser Semiconductor Optical Amplifier, or a laser modulator Semiconductor Optical Amplifier.

Embodiments further provide a method of fabricating a semiconductor optical device comprising:

A. providing a substrate material of n-doped III-V semiconductor material with a longitudinal axis, a bottom surface and a top surface;

B. etching said substrate material so as to form a substrate having a base with a planar bottom surface and an upper surface, side walls perpendicular to said base, and a central longitudinal cavity of U-shaped cross-section, the height S of the upper surface from the planar bottom surface being constant and equal to $\delta 1$ along the first active zone and varying from $\delta 1$ at the junction to $\delta 0$ at the free end of the first taper zone, with $\delta_0$ greater than $\delta_1$, C. performing an epitaxial growth of a layer of n-doped III-V semi-conductor (2) and a layer of n-inactive III-V material stack (intended to constitute a n-inactive III-V Optical Guide) of thickness h to fill the cavity;

D. selectively etching the layer of n-inactive III-V material stack so that it defines a slope from the free end of the first taper zones down to the first junction, with the height h varying along the first taper zone, from the first junction down to 0 at the free end of the first taper zone;

E. performing, on the layer of n-inactive III-V material stack inside the cavity, an epitaxial growth an active III-V material stack (intended to constitute a n-inactive III-V Optical Guide;

F. performing, on said active III-V material stack inside the cavity, an epitaxial growth of a layer of p-doped III-V semi-conductor up to at least the level of the top of the side walls;

G. removing the remaining portions of the first dielectric layer;

H. selectively etching, into the n-inactive III-V optical waveguide and along the longitudinal axis, a pair of channels, each located along each side wall so as to define a central ribbon comprising:

the layer of n-inactive III-V optical waveguide having an inverted T shape in a cross-section perpendicular to the longitudinal axis, so as to form a slab with a bottom of thickness $\varepsilon$ and an edge of thickness $\gamma$, with $\varepsilon$ being constant and equal to $\varepsilon 1$ within the first active zone and varying within the first taper zone from $\varepsilon 1$ at the first junction to 0 at the free end of zone, with $\gamma$ being constant and equal to $\gamma 1$ in the first active zone and varying within the first taper zone from $\gamma 1$ at the first junction to 0 at the free end of the first taper zone;

the etched active material stack constituting an active optical guide, and the etched layer of p-doped III-V semi-conductor material;

I. inside the channels, performing regrowth of an insulating or semi-insulating stack up to at least the level of the top of the layer of p-doped III-V semi-conductor material;

J. depositing, along said longitudinal axis XX', metal stripes on the top of the side walls and on the top of the central ribbon.

Advantageously, step B may comprise the sub-steps of:

B1—depositing a first dielectric layer on said top surface;

B2—patterning said first dielectric layer so as to define at least 2 zones along said longitudinal axis including a first zone intended to constitute the first active zone and a second zone intended to constitute the first taper zone, said first active zone and said first taper zone being delimited by a first junction, B3—etching said first dielectric layer so that it is entirely etched along the first active zone in a central rectangle-shaped portion of width $\alpha_1$ and partially etched along the first taper zone in a central trapezoidal portion of width $\alpha$ varying from $\alpha_1$ at the junction to $\alpha_0$ at the end of the first taper zone that is opposite to said junction.

The first dielectric layer may be based on $SiO_2$ or $Si_3N_4$.

Advantageously, step D of selectively etching the layer of n-inactive III-V material stack may comprise the sub-steps of:

D1—depositing on said layer of n-inactive III-V material stack, a layer of second dielectric layer of thickness D;

D2—patterning and etching said second dielectric layer along said longitudinal axis XX' so that said second dielectric layer is s not etched along the first active zone and partially etched along the first taper zone, the thickness D decreasing from D at the first junction to 0 at the end of the first taper zone that is opposite to said first junction;

D3—removing said second dielectric layer.

Preferably, the sub-steps B2 or D2 of patterning the first and second dielectric layers may comprise the sub-steps of:

applying a layer of positive photoresin on the top surface of the first or second dielectric layers;

applying a gray lithographic mask to said layer of positive photoresin, said gray lithographic mask comprising:

in the case of sub-step B2, a transparent area corresponding to the central rectangle-shaped portion in the first active area and an area corresponding to the central trapezoidal portion in the first taper zone and the opacity of which progresses along the first zone area from full transparency at the junction to full opacity at the end of the first taper taper zone which is opposite to said junction;

in the case of sub-step D2, an opaque area corresponding to the form of the cavity in the first active zone and an area corresponding to the form of the cavity in the first taper zone, the opacity of which progresses along the first taper zone from full opacity at the junction to full transparency at the end of the first taper zone which is opposite to said junction, and wherein steps B3 or D3 comprise an irradiation of the positive photoresin and the lithography mask by Reactive Ion Etching.

Advantageously, step H of selectively etching, into the n-inactive III-V optical waveguide and along the longitudinal axis XX', a pair of channels, is realized in a similar manner as sub-step D2 and comprises the sub-steps of:

H1—depositing, on the top of the side walls and the top of the central ribbon, a third dielectric layer of thickness E;

H2—patterning and etching said third dielectric layer along said longitudinal axis XX' so that said third dielectric layer is s not etched along the first active zone and partially etched along the first taper zone, the thickness E decreasing from the first junction to the end of the first taper zone that is opposite to said first junction.

Preferably, sub-step H2 of patterning third dielectric layer may comprise the sub-steps of:

applying a layer of positive photoresin on the top of the side walls and the top of the central ribbon;

applying a gray lithographic mask to said positive photoresin, said gray lithographic mask having the form of the channels and being opaque along the first active zone area and less opaque along the first taper zone, the opacity progressing along the first taper area from full opacity at the junction to less opacity at the end of the first taper zone which is opposite to said junction;

irradiating the positive photoresin and the lithography mask by Reactive Ion Etching.

BRIEF DESCRIPTION OF THE DRAWINGS

Some example embodiments are now described, by way of example only, and with reference to the accompanying drawings in which:

FIGS. 5A, 5B, 5C and 5D show different other embodiments according to the first specific embodiment of an optoelectronic device D;

FIGS. 6 to 16 schematically represent the different steps of the process flow for fabricating a device according to the embodiments represented in FIGS. 6 to 9:

FIGS. 6A, 6B and 6C schematically represent steps A, B1 and B2;

FIGS. 7A, 7B and 7C schematically represent step B3;

FIGS. 8A, 8B and 8C schematically represent step C;

FIGS. 9A, 9B and 9C schematically represent step D1 and D2;

FIGS. 10A, 10B and 10C schematically represent step D3;

FIGS. 11A, 11B and 11C schematically represent steps E and F;

FIGS. 13A, 13B, 13C and 13D schematically represent steps H1 and H2;

FIGS. 14A, 14B, 14C and 14D schematically represent step I;

FIGS. 15A, 15B, 15C and 15D schematically represent step I';

FIG. 1A, 1B, 2A, 2C, 3A, 3B, 3C to 4 (above) schematically represent step J;

For each one of FIGS. 6 to 16, the reference A corresponds to cross-sectional views perpendicular to the XX' axis, one in the active zone (right-hand schema) and the other in a taper zone (first and/or second taper zones), while references B and C correspond respectively to the first embodiment (with a single taper zone) and the second embodiment (with two taper zones), each of views B and C comprising a top view and a cross-sectional view (except figures only comprising top views).

The same reference number represents the same element or the same type of element on all drawings, unless stated otherwise.

DETAILED DESCRIPTION

The figures and the following description illustrate specific exemplary embodiments of the invention. It will thus be appreciated that those skilled in the art will be able to devise various arrangements that, although not explicitly described or shown herein, embody the principles of the invention and are included within the scope of the invention. Furthermore, any examples described herein are intended to aid in understanding the principles of the invention and are to be construed as being without limitation to such specifically recited examples and conditions. As a result, the invention is not limited to the specific embodiments or examples described below, but by the claims and their equivalents.

In the following description, well-known functions or constructions by the man skilled in the art are not described in detail since they might obscure the invention in unnecessary detail.

In the following description of the figures, schematic representations are non-limiting and serve only for the understanding of the invention.

Figure 1A:
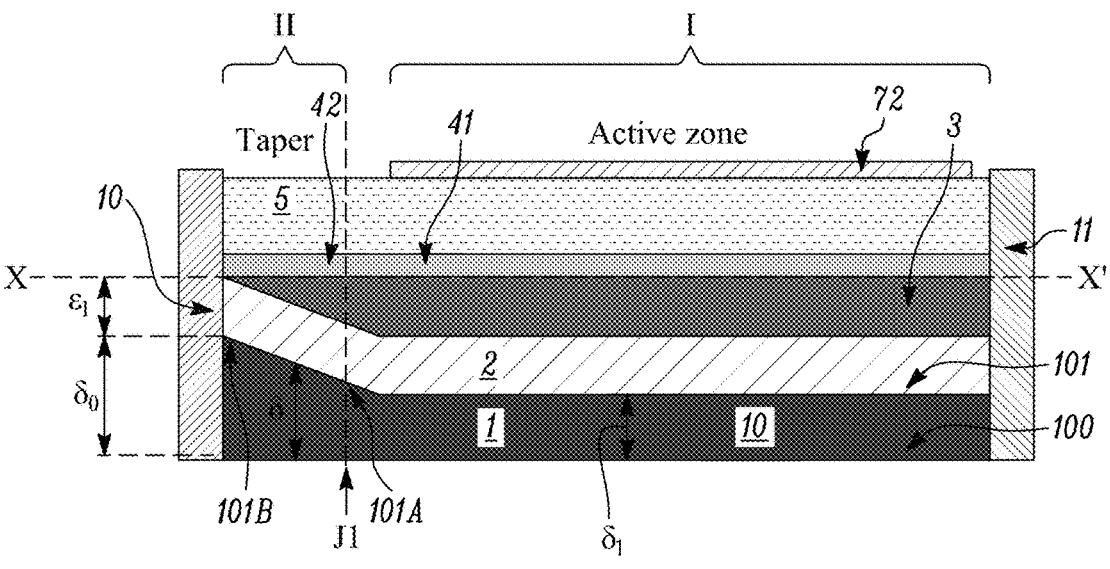
FIGS. 1A and 1B schematically represent a first embodiment of an optoelectronic device D according to the present invention, which comprises a longitudinal sectional view along the axis XX' of alignment of the optical waveguides (see 6A) and an overview of this embodiment (see 6B)
Figure 1B:
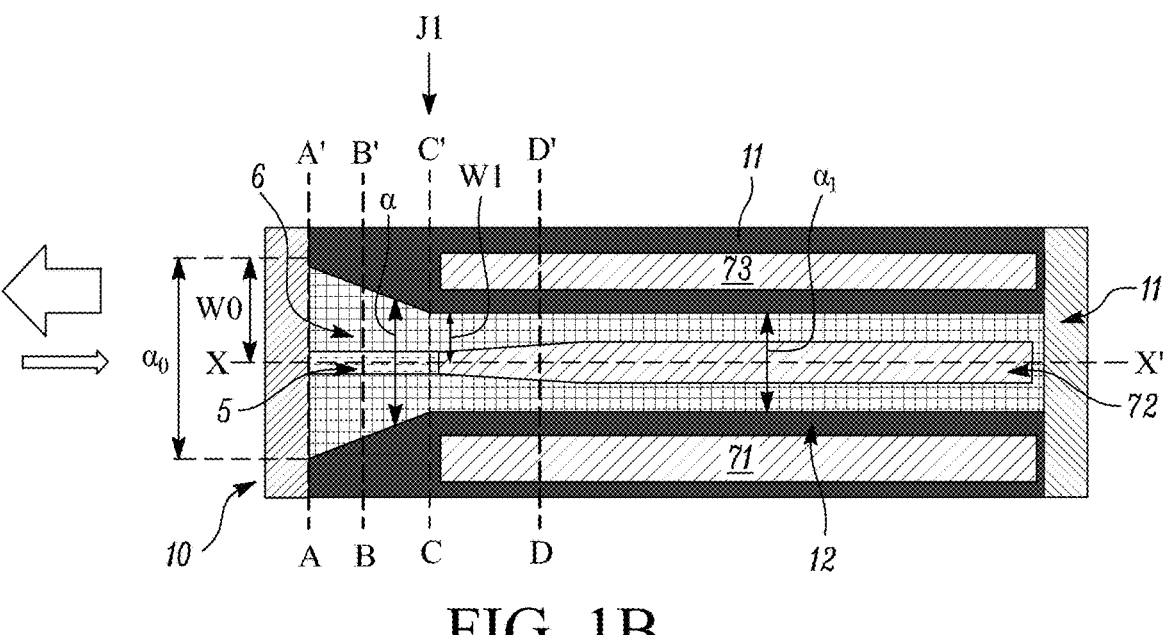

FIGS. 1A and 1B together with the cross-sectional views of FIG. 3 schematically represent a first specific embodiment of a Semiconductor optical device D according to the present invention that overcomes the above-mentioned drawbacks. This first specific embodiment of a Semiconductor optical device D comprises:

a substrate 1 (see FIG. 1A and FIG. 4) of n-doped III-V semiconductor material (for instance n-InP) with a longitudinal axis XX' and presenting a base 10 with a planar bottom surface 100 and an upper surface 101 (see FIG. 1A and FIG. 4) and side walls 11, 12 (see FIG. 4) perpendicular to the base 10, the substrate 1 including a central longitudinal cavity C of U-shaped cross-section, whose width α and height δ from the planar bottom surface 100 vary along said longitudinal axis XX'), so as to define at least 2 zones along said longitudinal axis XX' delimited by a first junction J1: a first active zone I and a first taper zone II;

within a first active zone I (see FIG. 1A), the bottom surface 100 and the upper surface 101 of the base 10 are parallel to each other and spaced from each other by a constant height $\delta=\delta 1$, and the central longitudinal cavity C presents a constant width $\alpha-\alpha 1$;

within a second zone II (see FIG. 1A) constituting a first taper zone II, wherein the upper surface 101 describes a continuous curved or planar surface comprising two opposite ends 101A, 101B (see FIG. 3) perpendicular to the longitudinal axis XX', one of the ends 101A being located at a height d1 at the first junction J1, with δ1 being smaller than the height δ0 at the free end of the first taper zone II, the width α varying from al at the first junction J1 to α0 at the free end of the first taper zone II;

a layer of n-doped III-V semi-conductor material 2 positioned on the upper surface 101 (see FIG. 1A and FIG. 4) of the base 10 inside the cavity C (see FIG. 4), a layer of n-inactive III-V optical waveguide material 3 positioned on the layer of n-doped III-V semi-conductor material 2 inside said cavity C (see FIG. 1A), this layer of n-inactive III-V optical waveguide material 3 having an inverted T shape in a cross-section perpendicular to the longitudinal axis XX' (see FIG. 3), so as to form a slab 3 with a bottom 31 of thickness ε and an edge (32) of thickness γ (see FIGS. 3B to 3D), with ε being constant and equal to ε1 within the first active zone I (FIGS. 3D, 1A and 2A) and varying within the first taper zone II from ε1 at the first junction J1 to 0 at the free end of the first taper zone II, and with γ being constant and equal to γ1 in the first active zone I and varying within the first taper zone II from γ1 at the first junction J1 to 0 at the free end of the first taper zone II;

a central ribbon R having a width b and comprising, on the edge 32 of the slab 3, a buried optical waveguide 4 (for instance based on AlGaInAs or GaInAsP MQW) beneath a layer of p-doped III-V semi-conductor 5 such as p-InP (see FIGS. 3B to 3D and 4), a pair of channels C1, C2 (FIGS. 1B, 3A-3D and 4) into the n-inactive III-V optical waveguide 3 along the longitudinal axis (XX) and being located on both sides of the central ribbon R, said longitudinal channels C1, C2 being each filled by a semi-insulating stack or an insulating stack 6 such as a Semi-Insulating Buried Heterostructure (SIBH) realized in one-step with Fe—InP or Ru—InP.

FIG. 1B notably shows that the channels C1, C2 are longitudinal and parallel to each other and of constant width W1 within the first active zone I, but the channels may present each the shape of a trapeze with a width increasing within the first taper zone from W1 at the first junction to WO at the free end of the first taper zone II.

FIG. 1B also shows that, within the first active zone I, metal stripes 71, 73 cover the top of each sidewall 11,12 and a metal stripe also covers the top of the layer of p-doped III-V semi-conductor (5)

The specific embodiment shown in FIGS. 1A and 1B is a device working in reflection. It comprises:

an anti-reflective coating $R_{min}$ 10 positioned at the free end of the first taper zone II, and a reflective coating $R_{max}$ 11 positioned at the end of the first active zone I that is opposite to the first junction J1 between said first active zone I and the first taper zone II, so that the anti-reflective coating Rmin 10 constitutes the entrance and the output of the semiconductor optical device D working in reflection.

Figure 2A:
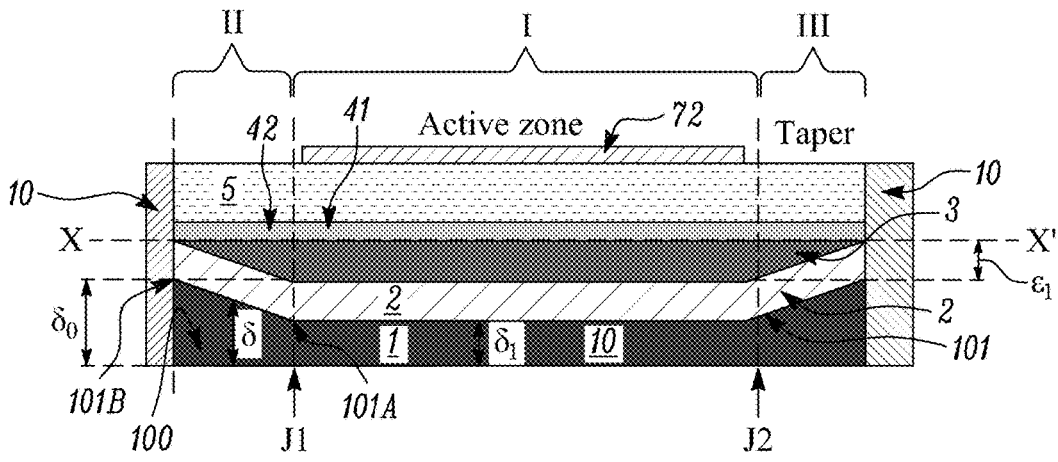
FIGS. 2A and 2B schematically represent a second embodiment of an optoelectronic device D according to the present invention, which comprises a longitudinal sectional view along the axis XX' of alignment of the optical waveguides (see 7A) and an overview of this embodiment (see 7B)
Figure 2B:
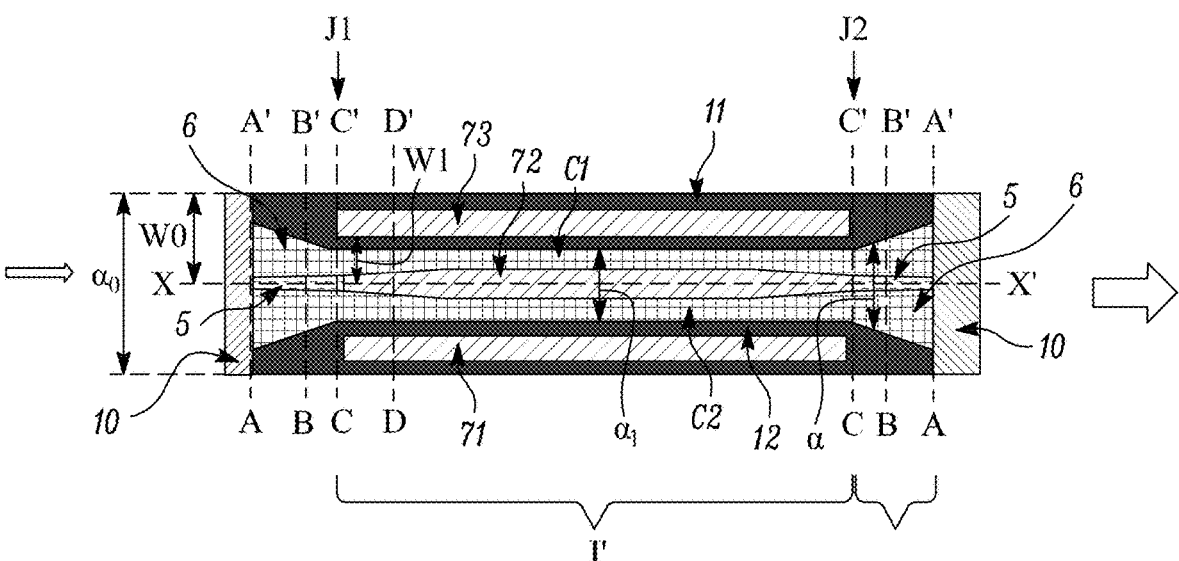

FIGS. 2A and 2B schematically represent a second specific embodiment of a Semiconductor optical device D according to the present invention that overcomes the above-mentioned drawbacks. FIGS. 2A and 2B differs from FIGS. 1A and 1B, respectively in that it is a device working in transmission (and not in reflection).

In particular, this second specific embodiment comprises:

in the same manner as in the first embodiment, an anti-reflective coating $R_{min}$ 10 positioned at the free end of the first taper zone II, and a second taper zone III at the end of the first active zone I that is opposite to the first junction J1, thus defining a second junction J2 between the second taper zone and the first active zone I, and another anti-reflective coating $R_{min}$ 10 positioned at the free end of the second taper zone III, so that one of the anti-reflective coatings $R_{min}$ 10 constitutes the entrance of said semiconductor optical device D and the other anti-reflective coatings $R_{min}$ 10 constitutes the output of said semiconductor optical device D working in transmission.

Figures 3A, 3B, 3C, 3D, 4:
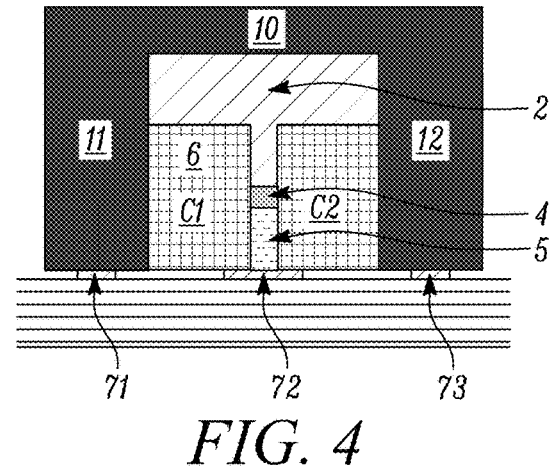
FIGS. 3A, 3B, 3C and 3D comprise four cross-sectional views of each of the embodiments shown in FIGS. 1 and 2 being taken along the taper (see 3A, 3B and 3C) and the first active zones (see 3D)
FIG. 4 is a cross-sectional view corresponding to the cross-sectional view 4C, which comprises metal contacts soldered on a flip-chip package.

FIG. 3 comprises four cross-sectional views of each of the embodiments shown in FIGS. 1 and 2 being taken along the taper (see 3A, 3B and 3C) and the first active zones (see 3D):

FIG. 3A is a cross-sectional of both embodiments according to the A-A' (at the free end of the first taper zone II);

FIG. 3B is a cross-sectional of both embodiments according to the B-B' (within the first taper zone II);

FIG. 3C is a cross-sectional of both embodiments according to the A-A' (at the first junction J1);

FIG. 3D is a cross-sectional of both embodiments according to the D-D' (within the first active zone I).

FIG. 3 clearly shows the evolution of the slab 3 (made of n-inactive III-V optical waveguide material) along the taper zone II (FIGS. 3A-3C) and the first active zone (FIG. 3D).

In the active zone I, the slab 3 comprises a bottom 31 of thickness ε and an edge 32 of thickness γ. FIG. 3D shows that, within the first active zone I, ε is constant and equal to ε1 and γ is constant and equal to γ1.

FIGS. 3A to 3C show that, along the taper zone II, ε varies from ε1 at the first junction J1 to 0 at the free end of the taper zone II, and γ varies from γ1 at the first junction J1 to 0 at the free end of the taper zone II.

FIG. 3 also shows that, on the edge 32 of slab 3, there is a buried optical waveguide 4 (for instance based on AlGaInAs or GaInAsP MQW) beneath a layer of p-doped III-V semi-conductor 5 such as p-InP. FIG. 3 also clearly show a pair of channels C1, C2 into the n-inactive III-V optical waveguide 3 along the longitudinal axis (XX) and being located on both sides of the central ribbon R, said longitudinal channels C1, C2 being each filled by a semi-insulating stack or an insulating stack 6 such as a Semi-Insulating Buried Heterostructure (SIBH) realized in one-step with Fe—InP or Ru—InP.

There are four factors to optimize the device for the most adiabatic transition:

The bottom width α of the cavity C,
The width of the ribbon β,
The thickness γ of the edge of the slab,
The thickness ε of the bottom of the slab.

wherein the width $α_1$ of the central longitudinal cavity (C) is constant within the first active zone (I).

The bottom width α of SOA slab 3 is as large as possible as long as the optical guide 4 stays single mode. Before the taper zone II, the width of the optical guide 4 formed on the upper part of the edge 32 of slab 3 decreases as small as possible as long as the optical mode stays in the active zone I. For example (3D), the central part of the optical guide 4 such as SOA has a 4 μm width and a 2 μm at the junction J1 between the SOA 1 and the taper zone II (FIG. 3B). The width of taper zone II is equal to the width of the active zone I at the junction J1 and decreases. For example, the taper zone II has a 2 μm width at the junction J1 (butt-joint) and 0.1 μm width at the end of the taper zone. The function of this taper zone II is to deconfine the optical mode to facilitate the optical coupling between the component and another component or an optical fiber.

FIG. 4 shows an additional sectional view (corresponding to the cross-sectional view 4A) of both embodiments of the Semiconductor optical device D according to the A-A' plane, being flip-chipped on an electronic package.

In FIGS. 1 to 4, the first active zone I comprises one optical function, for instance a Semiconductor optical amplifier or an Electro absorption Modulator (usually known by the acronym EAM).

Figures 5A, 5B, 5C, 5D:
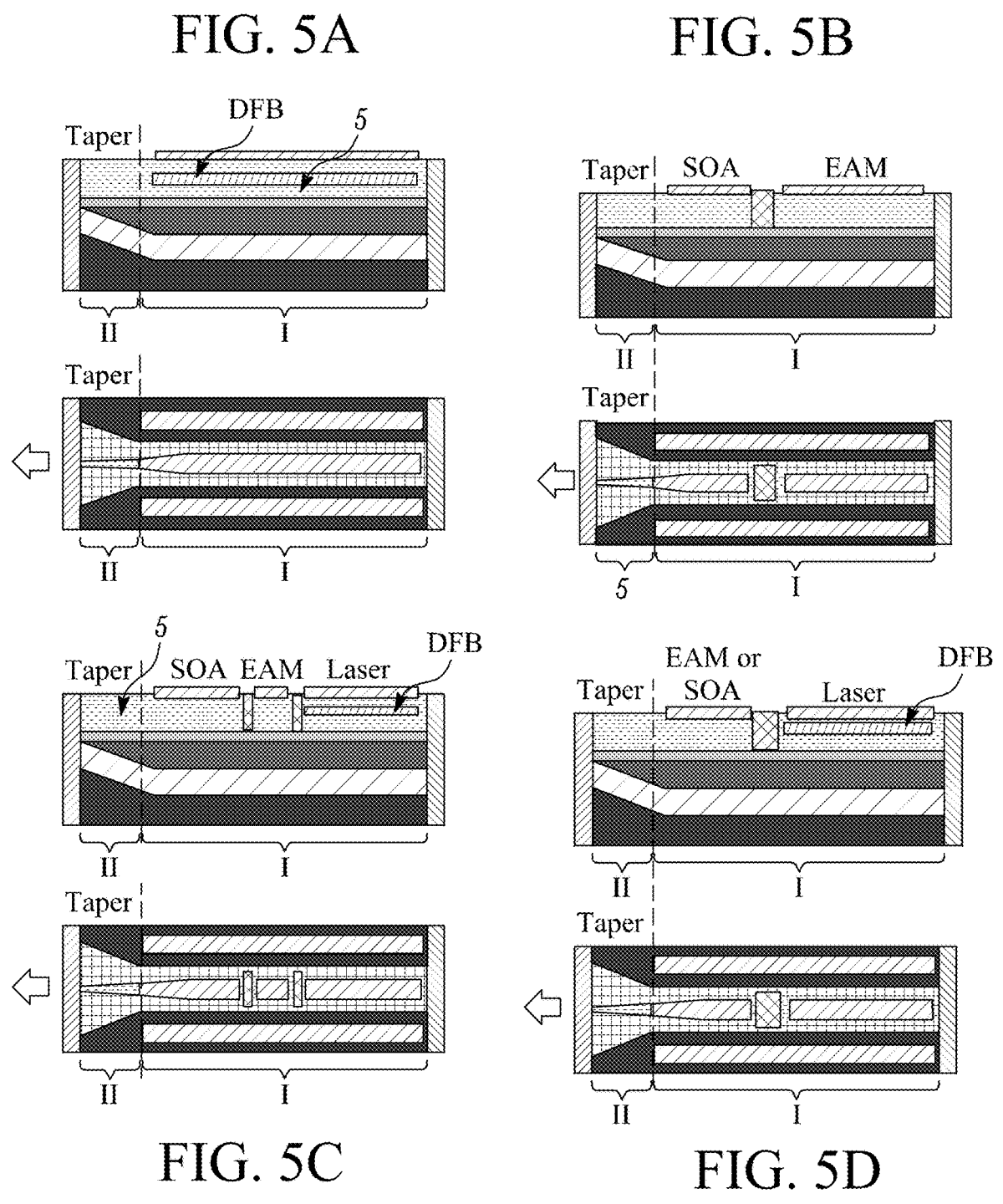

In FIGS. 5A to 5D, the Semiconductor optical device D corresponds to the first specific embodiment shown in FIGS. 1A and 1B working in reflection, with the first active zone I respectfully comprising:

In FIG. 5A, one optical function comprising a Distributed Feed-Back Laser (i.e. a Distributed Feedback Grating (or DFB grating) is etched inside the layer of p-doped III-V semi-conductor material 5);

In FIG. 5B, two optical functions comprising a SOA and a EAM, the Semiconductor optical device D being thus a reflective electro-absorption modulator monolithically integrated with semiconductor optical amplifier (REAM-SOA) (hereinafter referred to as the acronym REAMSOA);

In FIG. 5C, two optical functions comprising an EAM or a SOA and a Distributed Feed-Back Laser (with a DFB grating being etched inside the layer of p-doped III-V semi-conductor material 5), the Semiconductor optical device D constituting thus either an electro-absorption modulated laser (hereinafter referred to as the acronym EML and comprising a DFB laser and a EAM) or a Master Oscillator Power Amplifier (hereinafter referred to as the acronym MOPA and comprising a DFB laser and a SOA);

In FIG. 5D, three optical functions comprising a SOA, an EAM and a Distributed Feed-Back Laser (with a DFB grating being etched inside the layer of p-doped III-V semi-conductor material 5), the Semiconductor optical device D constituting an amplified EML (comprising a DFB laser, an EAM and a SOA).

FIGS. 6 to 16 (together with the above-described FIGS. 1 to 4) schematically represent the different steps of the process flow for fabricating a semiconductor optical device (D) according to the embodiments earlier described.

In particular, FIG. 6 schematically represents A, B1 and B2 being composed in detail of:

A) providing substrate material 1' made of n-doped III-V semiconductor material (for instance n-InP) with a longitudinal axis XX' (see FIGS. 5A and 5B), and presenting a bottom surface 100 and a top surface 110;

B1) depositing a first dielectric layer M1 (for instance based on based on $SiO_2$ or $Si_3N_4$) on said top surface 110;

B2) patterning the first dielectric layer M1 (for instance base on $SiO_2$ or $Si_3N_4$) so as to define at least 2 zones along said longitudinal axis XX including a first zone intended to constitute the first active zone I, a second zone II (see FIGS. 6B and 6C) and if applicable a third zone III (only FIG. 6C), the first active zone I and the first taper zone II being delimited by a first junction J1 (notably a butt-joint) and the first active zone I and the second taper zone III being delimited by a second junction J2 (notably a butt-joint).

The sub-step B2 of patterning the first dielectric layer M1 may comprise the sub-steps of:

applying a layer of positive photoresin on the top surface of the first dielectric layer M1 applying a gray lithographic mask to said layer of positive photoresin, the gray lithographic mask comprising a transparent area corresponding to the central rectangle-shaped portion in the first active zone I and an area corresponding to the central trapezoidal portion in the taper zone II, III, the opacity progressing along the taper zones II, III from full transparency at the junction J1, J2 to full opacity at the ends of the taper zones II opposite to said junctions J1, J2;

Then, FIG. 7 represents step B3 consisting in an irradiation of the positive photoresin and the lithography mask, the resin development and an etching by Reactive Ion Etching, so as to form a substrate 1 having a base 10 with a planar bottom surface 100 and an upper surface 101, side walls 11, 12 perpendicular to said base 10, and a central longitudinal cavity C of U-shaped cross-section, the height δ of the upper surface 101 from the planar bottom surface 100 being constant and equal to δ1 along the first active zone I and varying from δ1 at the junctions J1, J2 to $δ_0$ at the free end of the taper zones II, III), with $δ_0$ greater than $δ_1$.

Then, FIG. 8 represents step C composed in detail of:

performing an epitaxial growth of a layer of n-doped III-V semi-conductor 2, and performing an epitaxial growth of a layer of n-inactive III-V material stack 3 of thickness h to fill the cavity C;

Then, FIG. 9 represents steps D1 and D2 composed in detail of:

D1) depositing on said layer of n-inactive III-V material stack 3 a second dielectric layer M2 (for instance made of based on $SiO_2$ or $Si_3N_4$) of thickness D;

D2) patterning and etching the second dielectric layer M2 along the longitudinal axis XX' so that the second dielectric layer M2 is not etched at all along the first active zone I and partially etched along the taper zones II, III, the thickness D of this second dielectric layer decreasing from D at the junctions J1, J2 to 0 at the ends of the taper zones II, III opposite to the junctions J1, J2.

The sub-step D2 of patterning the second dielectric layer M may comprise the sub-steps of:

applying a layer of positive photoresin on the n-inactive III-V material stack 3 inside the cavity C;

applying a gray lithographic mask to said layer of positive photoresin, said gray lithographic mask comprising an opaque area corresponding to the form of the cavity C in the first active zone I and an area corresponding to the form of the cavity C in the taper zones II, III, the opacity of which progresses along the first taper zone II from full opacity at the junctions J1, J2 to full transparency at the end of the taper zones II, III opposite to the junctions J1, J2.

FIG. 10A to 10C schematically represent step D3 consisting in an irradiation of the positive photoresin and the lithography mask, the resin development and an etching by Reactive Ion Etching, so as to define a slope from the free end of each taper zone II, III down to the respective junctions J1, J2, with the height h of layer 3 varying along the taper zones II, III, from each junction J1, J2 down to 0 at the free end of the taper zones II, III. The n-inactive III-V material stack 3 is totally etched at the output of the taper zones II, III.

The second dielectric layer M2 is removed.

FIG. 11A to 11C schematically represent steps E and F comprising:

performing, on the layer of n-inactive III-V material stack 3 inside the cavity C, an epitaxial growth an active III-V material stack 4 (for instance based on AlGaInAs or GaInAsP MQW);

performing, on said active III-V material stack 4 inside the cavity C, an epitaxial growth of a layer of p-doped III-V semi-conductor 5 up to at least the level of the top of the side walls 11, 22.

Figures 12A, 12B, 12C:
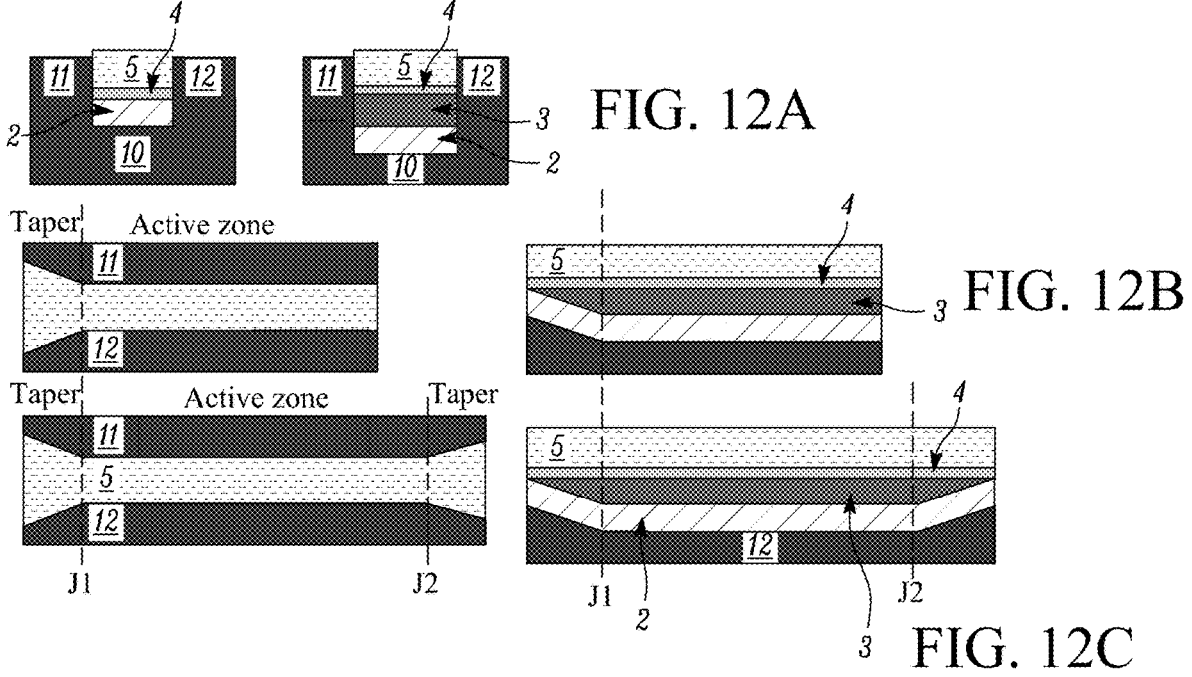
FIGS. 12A, 12B and 12C schematically represent step G.

Then, the remaining portions of the first dielectric layer M1 are removed, as shown by FIGS. 12A to 12C (step G).

Then, the next step comprises a selectively etching, into the n-inactive III-V optical waveguide 3 and along the longitudinal axis XX', a pair of channels C1, C2, each located along each side wall 21, 22 so as to define a central ribbon R comprising:

the layer of n-inactive III-V optical waveguide 3 having an inverted T shape in a cross-section perpendicular to the longitudinal axis (XX'), so as to form a slab 3 with a bottom 31 of thickness ε and an edge 32 of thickness γ, with ε being constant and equal to ε1 within the first active zone I and varying within the first taper zone II from ε1 at the first junction J1 to 0 at the free end of zone II, with γ being constant and equal to γ1 in the first active zone I and varying within the first taper zone II from γ1 at the first junction J1 to 0 at the free end of the first taper zone II;

the etched active material stack 4 constituting an active optical guide, and the etched layer of p-doped III-V semi-conductor material 5.

This selective etching step D is realized as follows:

FIG. 13A to 13C show that step H further comprises sub-steps H1 and H2 comprising:

H1—depositing, on the top of the side walls 11, 12 and the top of the central ribbon R, a third dielectric layer M3 of thickness E;

H2—patterning and etching said third dielectric layer M3 along the longitudinal axis XX' so that the third dielectric layer M3 is s not etched at all along the first active zone I and partially etched along the taper zones II, III, the thickness E decreasing from the junctions J1, J2 to the ends of the taper zone II, III opposite to the junctions J1, J2.

The sub-step H2 of patterning third dielectric layer (M3) may comprise the sub-steps of:

applying a layer of positive photoresin on the top of the side walls 11, 12 and the top of the central ribbon R;

applying a gray lithographic mask to said layer of positive photoresin, said gray lithographic mask having the form of the channels C1, C2 and being opaque along the first active zone I and less opaque along the taper zones II, III, the opacity of which progresses along the taper zones II, III from full opacity at the junction J1 to less opacity at the end of the taper zones II, III which is opposite to the junctions J1, J2;

irradiating the positive photoresin and the lithography mask by Reactive Ion Etching.

FIG. 14A to 14C schematically represent step I comprising the performing, inside the channels C1, C2, of the regrowth of insulating or a semi-insulating stack 6 up to at least the level of the top of the layer of p-doped III-V semi-conductor material 5.

Then the third dielectric layer M3 is removed (see FIG. 15: step I' of removing the remaining portions of the third dielectric layer M3).

Figures 16A, 16B, 16C, 16D:
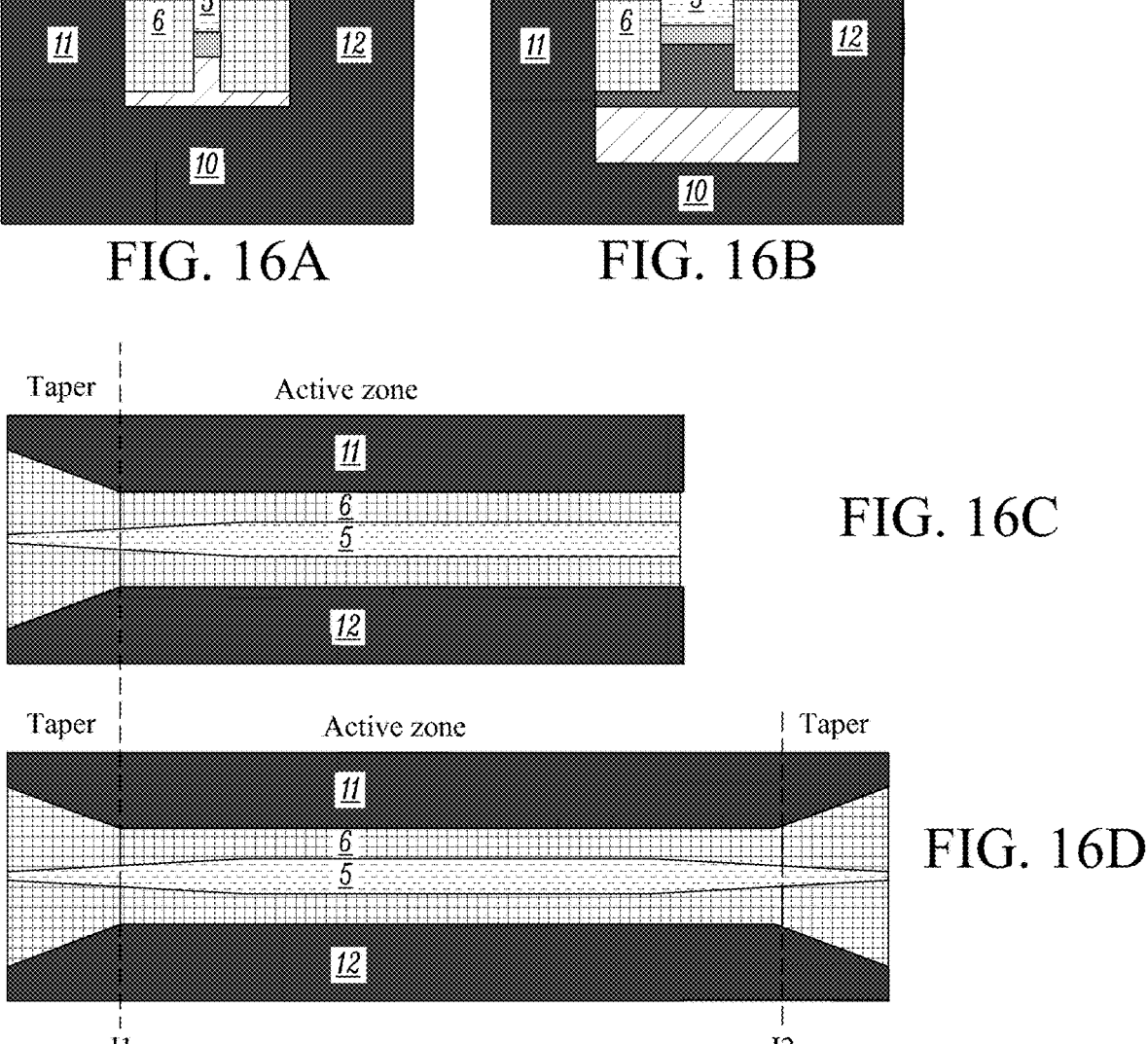
FIGS. 16A, 16B, 16C and 16D schematically represent step I"

The method of fabricating may further comprise between steps I') and J), a step II") of chemical and/or mechanical surface stripping of the regrown insulating or semi-insulating stack, to flatten it to the level of the top of the side walls (see FIG. 16).

Figures 17A, 17B:
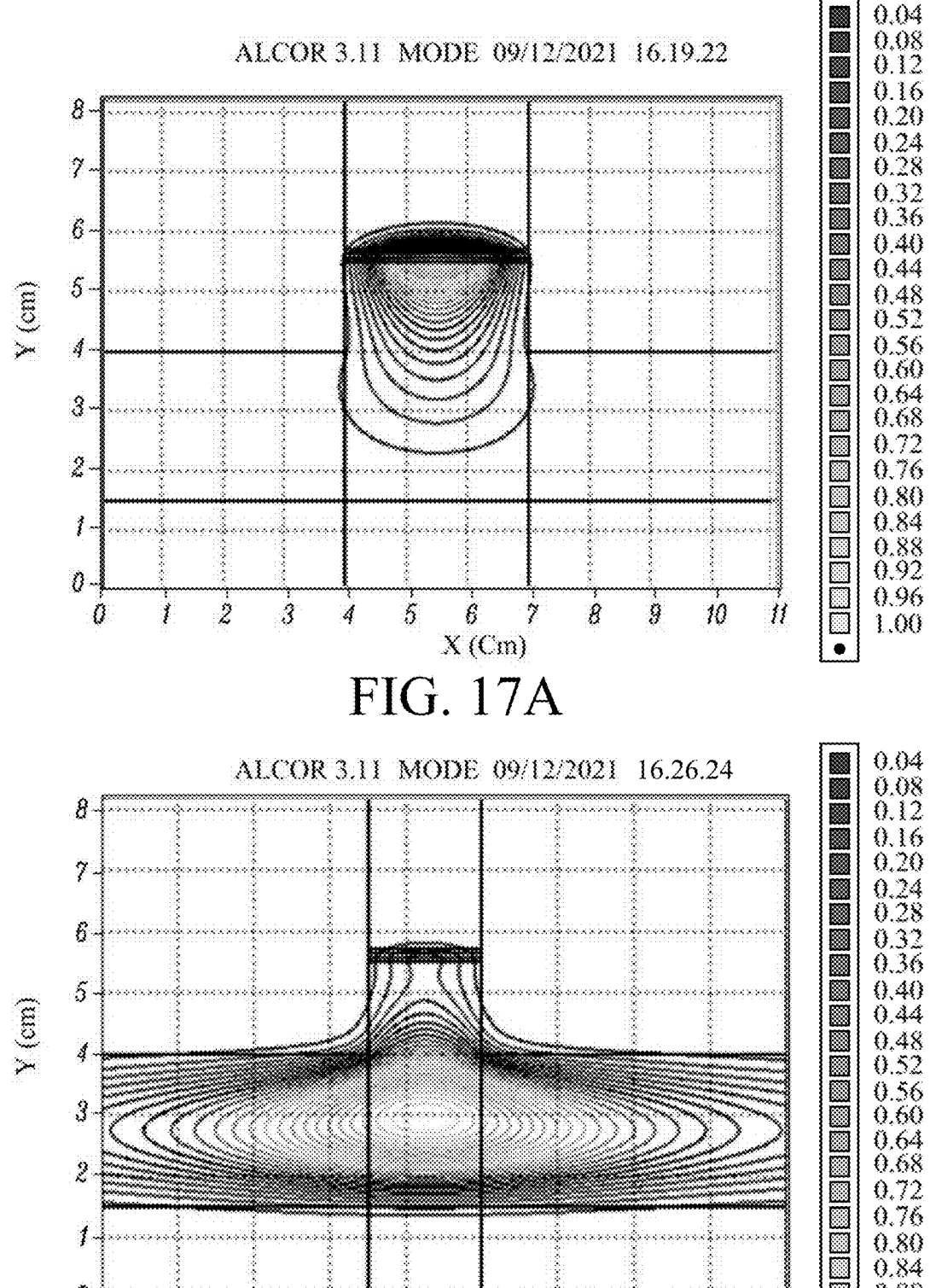
FIGS. 17A and 17B show two ALCOR software simulations using a beam propagation method, based on a device according to the prior art with a slab structure having a width $\beta$ from 3 μm to 1.5 μm, with a step of 0.5 μm.
Figures 18, 19:
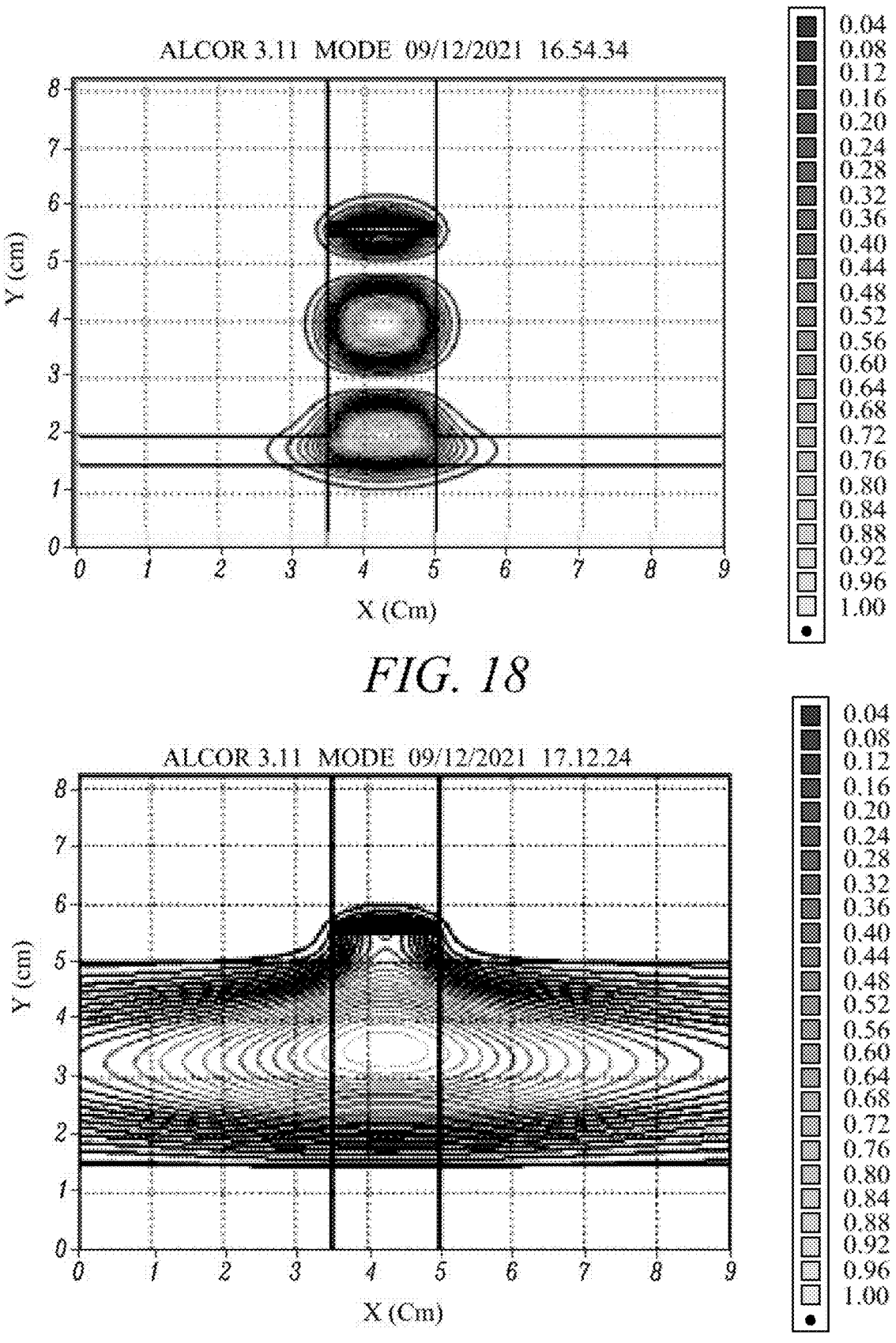
FIG. 18 show one ALCOR software simulation using a beam propagation method, based on a device according to the prior art with a deeper slab having a width $\beta$ of 1.5 μm.
FIG. 19 show one ALCOR software simulation using a beam propagation method, based on a device according to the prior art with a shallower slab structure with a width $\beta$ of 1.5 μm.

FIGS. 17 to 19 show different ALCOR software simulations using a beam propagation method, based on a device according to the prior art. Usually, a taper in Semiconductor optical devices is a simple shrinkage of the active layer. However, in a case of a slab structure, it is less evident. All the ALCOR software simulations of FIGS. 17 to 19 show that:

the optical guide keeps the single mode performances by decreasing the width of the active layer (FIG. 17A).

If the width of the decreases the optical mode leaves the active layer where is the amplification to the slab layer. The optical mode becomes less circular and flatter and more extended, which is a drawback for the coupling (FIG. 17).

in case of a deeper slab, the optical guide becomes multimode, which is a drawback because the optical power will spread out over the different optical modes. There will be an optical performance loss (FIG. 18).

in case a shallower slab, the optical mode leaves the active layer where is the amplification to the slab layer. The optical mode becomes less circular and flatter and more extended than previously, which is still a drawback for the coupling (FIG. 19).

Figures 20A, 20B:
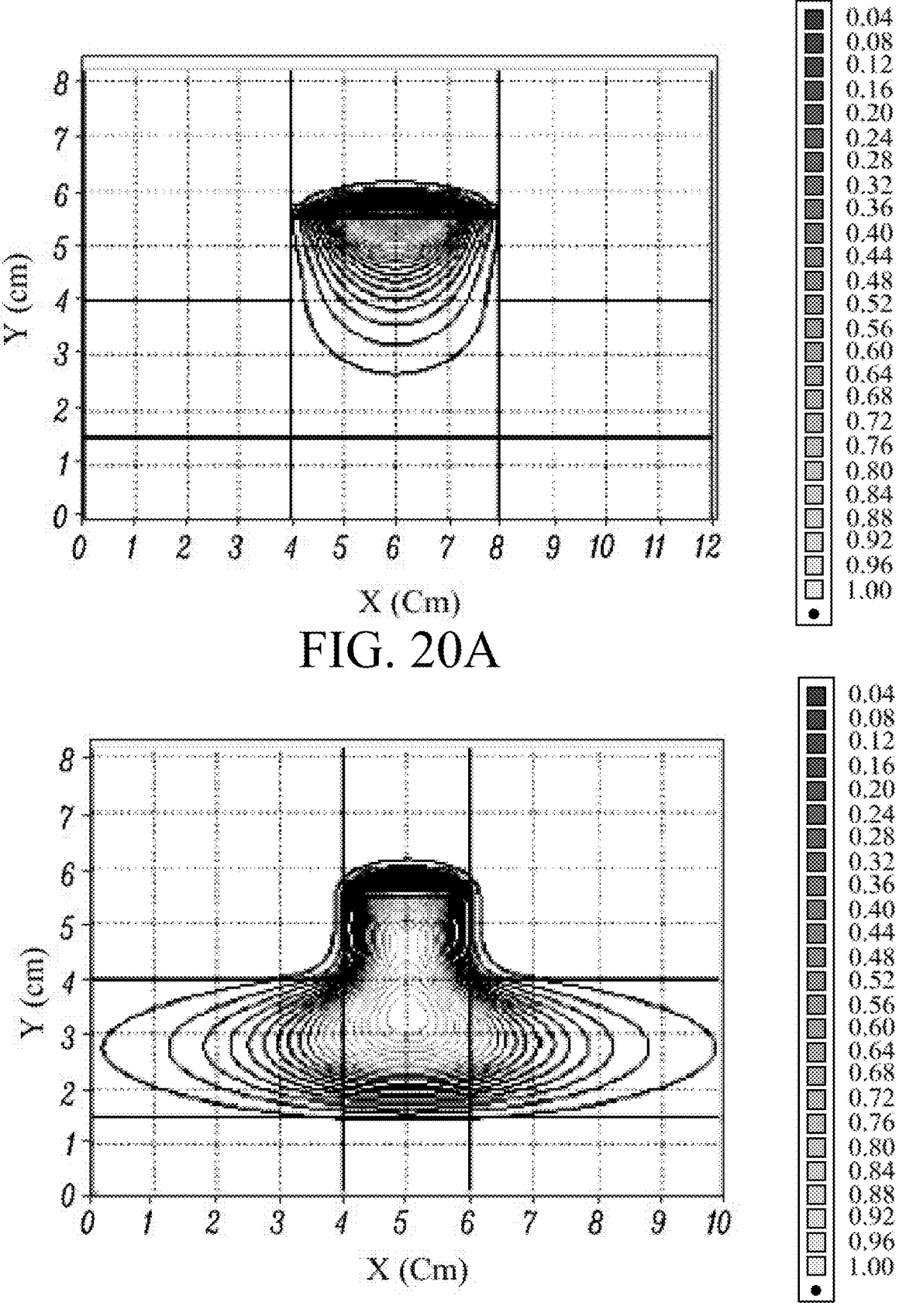
FIGS. 20A, 20B, 20C, 20D and 20E show 4 ALCOR software simulations using a beam propagation method, based on a device according to the invention.
Figures 20C, 20D:
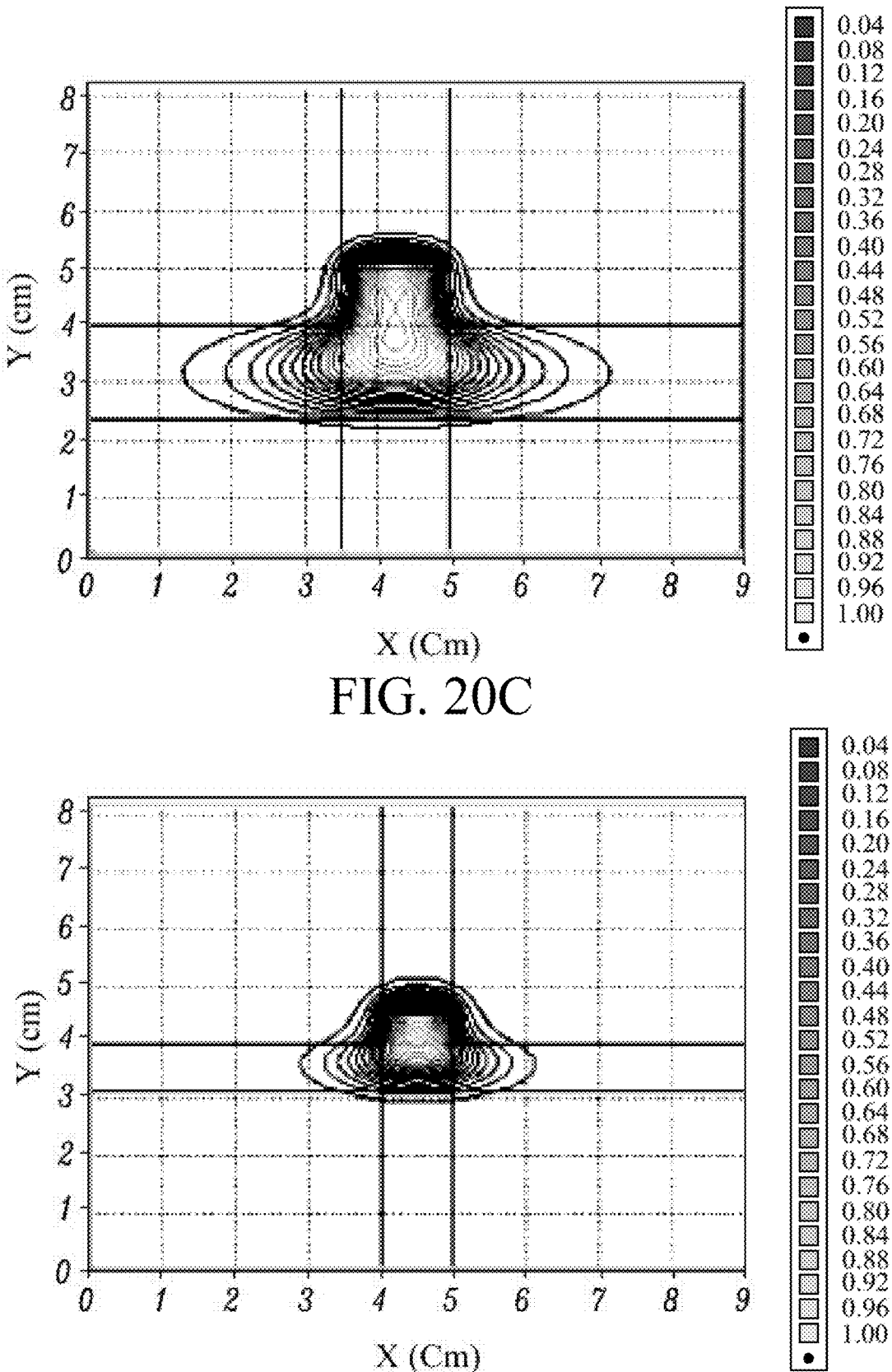
Figure 20E:
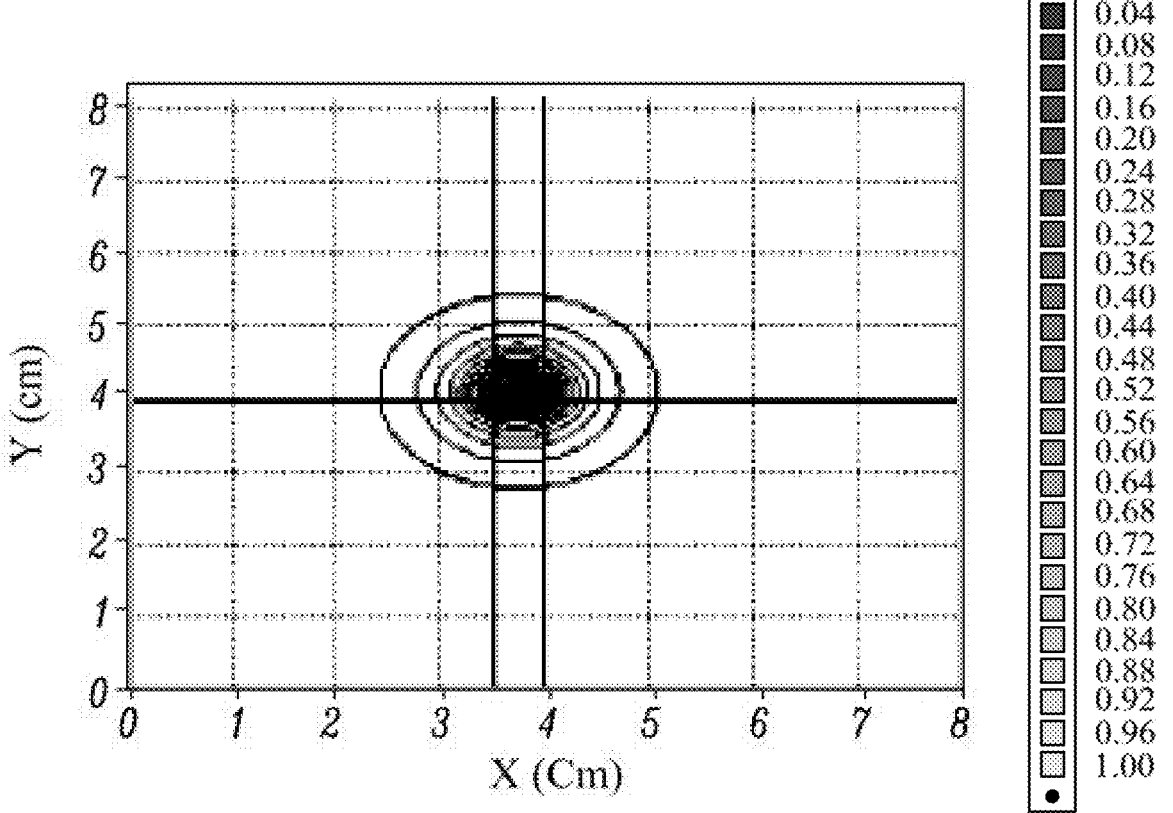

FIG. 20 show 4 ALCOR software simulations using a beam propagation method, based on a device according to the invention In FIG. 20*a*, the optical mode is located in the larger part of the active zone I (width $\beta$ of 4 $\mu$m). The slab design permits to increase the width $\beta$ to increase the gain in the active section I.

When the width of the ribbon decreases (down to 2 $\mu$m) to reach the entrance of the taper, the optical mode is located in the MQW layers of the optical waveguide but overlaps the slab layer (FIG. 20 *b*).

By decreasing further the width of the slab 3 and by decreasing the width of the ribbon (down to 1.5 $\mu$m), it is possible to keep the a single optical mode and to increase the confinement of the optical mode in the MQW layers of the optical waveguide 4 and to decrease the confinement of the optical mode in the slab layer (FIG. 20*c* et FIG. 20*d*):

For a width of 1.5 $\mu$m, the optical mode is located at the entrance of the taper zone II (FIG. 20 *c*), For a width of 1 $\mu$m the optical mode is located in the taper zone II (FIG. 20 *d*).

By decreasing further the width of the slab layer and by decreasing the width of the ribbon (down to 0.5 $\mu$m), the optical mode is located at the output of the taper zone II. The modelisation shown in FIG. 20 is computed by considering that the thickness of the slab layer varies linearly with the width of the ribbon $\beta$.

The invention claimed is:

1. Semiconductor optical device comprising:
a substrate of n-doped III-V semiconductor material with a longitudinal axis and presenting a base with a planar bottom surface and an upper surface and side walls that are perpendicular to said base,
said substrate including a central longitudinal cavity of U-shaped cross-section, whose width $\alpha$ and height d from the planar bottom surface vary along said longitudinal axis, so as to define at least 2 zones along said longitudinal axis delimited by a first junction,
a first active zone, wherein the bottom surface and the upper surface of the base are parallel to each other and spaced from each other by a constant height d=d1, and the central longitudinal cavity presents a constant width $\alpha=\alpha_1$,
a second zone constituting a first taper zone, wherein the upper surface describes a continuous curved or planar surface comprising two opposite ends perpendicular to the longitudinal axis, one of the ends, being located at a height d1 at the first junction which is lower than the height $d_0$ at the free end of the first taper zone, the width $\alpha$ varying from $\alpha_1$ at the first junction to $\alpha_0$ at the free end of the first taper zone, a layer of n-doped III-V semi-conductor material positioned on the upper surface of the base inside the cavity;
a layer of n-inactive III-V optical waveguide material positioned on the layer of n-doped III-V semi-conductor material inside said cavity, said layer of n-inactive III-V optical waveguide material having an inverted T shape in a cross-section perpendicular to the longitudinal axis, so as to form a slab with a bottom of thickness e and an edge of thickness g, with e being constant and equal to $e_1$ within the first active zone and varying within the first taper zone from $e_1$ at the first junction to 0 at the free end of the first taper zone, and with g being constant and equal to $g_1$ in the first active zone and varying within the first taper zone from $g_1$ at the first junction to 0 at the free end of the first taper zone;
said semiconductor optical device further comprising,
a central ribbon having a width b and comprising, on the edge of the slab, a buried optical waveguide (4) beneath a layer of p-doped III-V semi-conductor,
a pair of channels into the n-inactive III-V optical waveguide along the longitudinal axis and being located on both sides of the central ribbon, said longitudinal channels being each filled by a semi-insulating stack or an insulating stack, said channels being longitudinal and parallel to each other and of constant width $W_1$ within the first active zone,
within the first active zone, metal stripes covering the top of each sidewall and a metal stripe covering the top of the layer of p-doped III-V semi-conductor.

2. Semiconductor optical amplifier device according to claim 1, further comprising:
an anti-reflective coating $R_{min}$ positioned at the free end of the first taper zone, and
a reflective coating $R_{max}$ positioned at the end of the SOA zone that is opposite to the first junction between said SOA zone and said first taper zone,
so that the anti-reflective coating $R_{min}$ constitutes the entrance and the output of said semiconductor optical amplifier device working in reflexion.

3. Semiconductor optical amplifier device according to claim 1, further comprising:
a second taper zone at the end of the SOA zone that is opposite to the first junction, thus defining a second junction between the second tape zone and the SOA zone,
another anti-reflective coating $R_{min}$ positioned at the free ends of the first taper zone and second taper zone,
so that one of the anti-reflective coatings $R_{min}$ constitutes the entrance of said semiconductor optical amplifier device and the other anti-reflective coatings $R_{min}$ constitutes the output of said semiconductor optical amplifier device working in transmission.

4. Semiconductor optical device according to claim 1, wherein the width $\alpha_1$ of the central longitudinal cavity within the first active zone is constant.

5. Semiconductor optical device according to claim 1 wherein, within the first taper zone, the width $\alpha$ of the central longitudinal cavity increases from $\alpha_1$ at the first junction and, if applicable, at the second junction to $\alpha_0$ at the free end of the first taper zone.

6. Semiconductor optical device according to claim 1, wherein a width b of the central ribbon within the first active zone continuously varies from 1.5 $\mu$m at the first junction and to 15 $\mu$m in the middle of the first active zone, and the width b of the central ribbon within the first taper zone varies from 1.5 μm at the first junction to 0.1 μm at the free ends of the first taper zone and, if applicable, of the second taper zone.

7. Semiconductor optical device according to claim 1, wherein the upper surface of the base is planar and defines a slope from one of the free end of the first down to the first junction, said slope having a height difference $d_0$-$d_1$ of 0.05 μm.

8. Semiconductor optical device according to claim 1, wherein the slab presents a global height h=e+g varying:

within the first active zone, from 1 μm at the first junction to 10 μm in the middle of the first active zone, within the first, from 1 μm at the first junction, at the second junction to 0 at the free end of the first taper zone.

9. Semiconductor optical device according to claim 1, wherein the length of the first taper zone, varies from 20 μm to 200 μm, with a global height h=e+g at the junction and, if applicable, at the second junction, varying from 1 μm to 10 μm.

10. Semiconductor optical device according to claim 1, wherein the first active zone comprises a Semiconductor optical amplifier, or a laser, or a modulator, or a laser modulator, or a laser Semiconductor Optical Amplifier, or a laser modulator Semiconductor Optical Amplifier.

11. Method of fabricating a semiconductor optical device comprising:

A) providing a substrate material made of n-doped III-V semiconductor material with a longitudinal axis, and presenting a bottom surface and a top surface;

B) etching said substrate material so as to form a substrate having a base with a planar bottom surface and an upper surface, side walls perpendicular to said base, and a central longitudinal cavity of U-shaped cross-section, the height d of the upper surface from the planar bottom surface being constant and equal to d1 along the first active zone and varying from d1 at the junction to d0 at the free end of the first taper zone, with $d_0$ greater than $d_1$;

C) performing an epitaxial growth of a layer of n-doped III-V semi-conductor and a layer of n-inactive III-V material stack of thickness h to fill the cavity;

D) selectively etching the layer of n-inactive III-V material stack so that it defines a slope from the free end of the first taper zones down to the first junction, with the height h varying along the first taper zone, from the first junction down to 0 at the free end of the first taper zone;

E) performing, on the layer of n-inactive III-V material stack inside the cavity, an epitaxial growth an active III-V material stack;

F) performing, on said active III-V material stack inside the cavity, an epitaxial growth of a layer of p-doped III-V semi-conductor up to at least the level of the top of the side walls;

G) removing the remaining portions of the first dielectric layer;

H) selectively etching, into the n-inactive III-V optical waveguide and along the longitudinal axis, a pair of channels, each located along each side wall so as to define a central ribbon comprising, the layer of n-inactive III-V optical waveguide having an inverted T shape in a cross-section perpendicular to the longitudinal axis, so as to form a slab with a bottom of thickness e and an edge of thickness g, with e being constant and equal to e1 within the first active zone and varying within the first taper zone from e1 at the first junction to 0 at the free end of zone, with g being constant and equal to g1 in the first active zone and varying within the first taper zone from g1 at the first junction to 0 at the free end of the first taper zone;

the etched active material stack constituting an active optical guide, and the etched layer of p-doped III-V semi-conductor material;

I) inside the channels, performing regrowth of an insulating or semi-insulating stack up to at least the level of the top of the layer of p-doped III-V semi-conductor material;

J) depositing, along said longitudinal axis, metal stripes on the top of the side walls and on the top of the central ribbon.

12. Method according to claim 11, wherein step B comprises the sub-steps of:

B1—depositing a first dielectric layer on said top surface;

B2—patterning said first dielectric layer so as to define at least 2 zones along said longitudinal axis including a first zone intended to constitute the first active zone and a second zone intended to constitute the first taper zone, said first active zone and said first taper zone being delimited by a first junction, B3—etching said first dielectric layer so that it is entirely etched along the first active zone in a central rectangle-shaped portion of width $\alpha_1$ and partially etched along the first taper zone in a central trapezoidal portion of width a varying from $a_1$ at the junction to $a_0$ at the end of the first taper zone that is opposite to said junction.

13. Method according to claim 10, wherein step D of selectively etching the layer of n-inactive III-V material stack comprises the sub-steps of:

D1—depositing on said layer of n-inactive III-V material stack a second dielectric layer of thickness D;

D2—patterning and etching said dielectric layer along said longitudinal axis so that said dielectric layer is s not etched at all along the first active zone and partially etched along the first taper zone, the thickness D decreasing from D at the first junction to 0 at the end of the first taper zone that is opposite to said junction;

D3—removing said second dielectric layer.

14. Method according to claim 12, wherein the sub-steps B2 or D2 of patterning the first and second dielectric layers comprises the sub-steps of:

applying a layer of positive photoresin on the top surface of the first or second dielectric layers;

applying a gray lithographic mask to said layer of positive photoresin, said gray lithographic mask comprising, in the case of subs-step B2, a transparent area corresponding to the central rectangle-shaped portion in the first active zone and an area corresponding to the central trapezoidal portion in the first taper zone and the opacity of which progresses along the first taper zone from full transparency at the junction to full opacity at the end of the first taper area which is opposite to said junction;

in the case of sub-step D2, an opaque area corresponding to the form of the cavity in the first active zone and an area corresponding to the form of the cavity in the first taper zone, the opacity of which progresses along the first taper zone from full opacity at the junction to full transparency at the end of the first taper zone which is opposite to said junction, and wherein steps B3 or D3 comprise an irradiation of the positive photoresin and the lithography mask by Reactive Ion Etching.

15. Method according to claim 11, wherein step H of selectively etching, into the n-inactive III-V optical waveguide and along the longitudinal axis, a pair of channels, is realized in a similar manner as sub-step D2 and comprises the sub-steps of:

H1—depositing, on the top of the side walls and the top of the central ribbon, a third dielectric layer of thickness E;

H2—patterning and etching said third dielectric layer along said longitudinal axis so that said third dielectric layer is not etched at all along the first active zone and partially etched along the first taper zone, the thickness E decreasing from the first junction to the end of the first taper zone that is opposite to said first junction.

16. Method according to claim 15, wherein step the sub-step H2 of patterning third dielectric layer comprises the sub-steps of:

applying a layer of positive photoresin on the top of the side walls and the top of the central ribbon;

applying a gray lithographic mask to said layer of positive photoresin, said gray lithographic mask having the form of the channels and being opaque along the first active zone and less opaque along the first taper zone, the opacity of which progresses along the first taper area from full opacity at the junction to less opacity at the end of the first taper zone which is opposite to said junction;

irradiating the positive photoresin and the lithography mask by Reactive Ion Etching.

\* \* \* \* \*